US012787830B2

(12) United States Patent
Kwon

(10) Patent No.: US 12,787,830 B2
(45) Date of Patent: Nov. 3, 2026

(54) SEMICONDUCTOR PACKAGE AND SUBSTRATE FOR SEMICONDUCTOR PACKAGE

(71) Applicant: Samsung Electronics Co., Ltd., Suwon-si (KR)

(72) Inventor: Jin Mo Kwon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 871 days.

(21) Appl. No.: 17/862,618

(22) Filed: Jul. 12, 2022

(65) Prior Publication Data

US 2023/0076402 A1 Mar. 9, 2023

(30) Foreign Application Priority Data

Sep. 3, 2021 (KR) ........................ 10-2021-0117288

(51) Int. Cl.
*H01L 23/498* (2006.01)
*H01L 23/00* (2006.01)
(Continued)

(52) U.S. Cl.
CPC ....... *H10W 70/685* (2026.01); *H10W 70/635* (2026.01); *H10W 74/117* (2026.01);
(Continued)

(58) Field of Classification Search
CPC ......... H01L 23/49816; H01L 23/49838; H01L 23/3107; H01L 23/49833; H01L 24/03; H01L 24/83; H01L 24/85; H01L 24/5226; H01L 2224/32145; H01L 2224/48091; H01L 2224/48145; H01L 2224/83191; H01L 2224/8592; H01L 2224/03011; H01L 25/18; H01L 2225/06506; H01L 2225/0651; H01L 2225/06565; H01L 2924/00014; H01L 2924/15311;
(Continued)

(56) References Cited

U.S. PATENT DOCUMENTS 7,986,048 B2 7/2011 Park et al.
8,024,857 B2 9/2011 Jung et al.
(Continued)

FOREIGN PATENT DOCUMENTS

KR 10-2007-0064704 A 6/2007

*Primary Examiner* — John M Parker
(74) *Attorney, Agent, or Firm* — Harness, Dickey & Pierce, P.L.C.

(57) ABSTRACT

A semiconductor package is provided. A semiconductor package includes a semiconductor package comprising a connecting structure in which a connecting terminal is placed in a lower part, and a semiconductor chip which is placed on the connecting structure and connected to the connecting structure, wherein the connecting structure includes a plurality of wiring layers placed to be stacked, a plurality of insulating layers between the wiring layers, and first and second passivation layers which each covers at least a part of an uppermost layer of the plurality of insulating layers and the wiring layer placed on the uppermost layer, and a through vias which penetrates the plurality of insulating layers, wherein the through via comes into contact with a lower surface of the first passivation layer and an upper surface of the second passivation layer.

20 Claims, 27 Drawing Sheets

1000

(51) Int. Cl.

| | |
|---|---|
| ***H01L 23/31*** | (2006.01) |
| ***H01L 25/065*** | (2023.01) |
| ***H10W 70/63*** | (2026.01) |
| ***H10W 70/685*** | (2026.01) |
| ***H10W 72/00*** | (2026.01) |
| ***H10W 74/10*** | (2026.01) |
| ***H10W 90/00*** | (2026.01) |
| ***H10W 90/24*** | (2026.01) |

(52) U.S. Cl.
CPC .......... *H10W 72/884* (2026.01); *H10W 90/00* (2026.01); *H10W 90/24* (2026.01); *H10W 90/734* (2026.01); *H10W 90/754* (2026.01)

(58) Field of Classification Search
CPC ... H01L 2924/181; H01L 2924/49833; H10W 90/00; H10W 90/297; H10W 90/724; H10W 90/722; H10W 90/732; H10W 90/792; H10W 70/685; H10W 70/634; H10W 74/117; H10W 20/20
USPC .................................................. 257/668, 693
See application file for complete search history.

(56) References Cited

U.S. PATENT DOCUMENTS

| | | | | |
|---|---|---|---|---|
| 8,351,217 | B2 | 1/2013 | Watanabe | |
| 9,330,947 | B2 | 5/2016 | Hu et al. | |
| 9,391,049 | B2 | 7/2016 | Lin et al. | |
| 10,079,225 | B2 | 9/2018 | Lin et al. | |
| 2012/0119346 | A1* | 5/2012 | Im | H10W 40/22<br>257/E23.18 |
| 2013/0200524 | A1 | 8/2013 | Han et al. | |
| 2014/0374893 | A1* | 12/2014 | Choi | H01L 25/0652<br>257/676 |
| 2021/0066197 | A1 | 3/2021 | We et al. | |
| 2021/0320067 | A1* | 10/2021 | Kim | H01L 23/49838 |

* cited by examiner 5308389.1

SEMICONDUCTOR PACKAGE AND SUBSTRATE FOR SEMICONDUCTOR PACKAGE

CROSS-REFERENCE TO RELATED APPLICATION

This application claims priority from Korean Patent Application No. 10-2021-0117288 filed on Sep. 3, 2021 in the Korean Intellectual Property Office, and all the benefits accruing therefrom under 35 U.S.C. 119, the contents of which in its entirety are herein incorporated by reference.

BACKGROUND

1. Field of the Invention

The present invention relates to a semiconductor package and a substrate for the semiconductor package.

2. Description of the Related Art

In recent years, with the tendency of miniaturization and lightening of electronic components, reduction of a semiconductor package mounted thereon is also required. Further, the thickness of the substrate for the semiconductor package is also gradually reduced, which makes it more difficult to control warpage of the substrate.

SUMMARY

Aspects of the present invention provide a semiconductor package having improved rigidity, by forming a via penetrating a substrate in a region between a region in which an outermost connecting terminal is placed and an outer peripheral surface of the substrate, among regions of the substrate.

According to an embodiment of the present disclosure, there is provided a semiconductor package comprising a semiconductor chip; and a connecting structure under the semiconductor chip, the connecting structure including a plurality of stacked wiring layers, a plurality of insulating layer between the plurality of stacked wiring layers, a first passivation layer covering at least a portion of an uppermost layer of the plurality of insulating layers, a second passivation layer covering at least a portion of a lowermost layer of the plurality of insulating layers, a connecting terminal on a lower part of the connecting structure, and at least one through via penetrating the plurality of insulating layers such that the at least one through via contacts a lower surface of the first passivation layer and an upper surface of the second passivation layer.

According to an embodiment of the present disclosure, there is provided a semiconductor package comprising a connecting structure including at least one wiring layer, at least one first insulating layer, second insulating layers above and below the at least one first insulating layer, and a through via penetrating the first insulating layer; a connecting terminal below the connecting structure; a semiconductor chip above the connecting structure; and a mold layer covering the semiconductor chip, wherein the through via does not contact the mold layer.

According to an embodiment of the present disclosure, there is provided a substrate comprising at least one wiring layer, at least one insulating layer, and at least one passivation layer on the insulating layer, each extending in a first direction and a second direction intersecting the first direction; a connecting terminal under a first region of the substrate; and a plurality of through vias in a second region of the substrate, the plurality of through vias extending along the first and second directions and penetrating a part of the substrate, wherein the plurality of through vias are not electrically connected to the connecting terminal, and the plurality of through vias do not contact an uppermost surface and side surfaces of the substrate.

Aspects of the present invention also provide a substrate for a semiconductor package having improved rigidity, by forming a through via penetrating the substrate in a region between a region in which an outermost connecting terminal is placed and an outer peripheral surface and/or edge of the substrate.

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present disclosure will become more apparent by describing in detail some example embodiments thereof referring to the attached drawings, in which.

DETAILED DESCRIPTION OF THE EMBODIMENTS

Hereinafter, a semiconductor package according to some embodiments will be described referring to FIGS. 1 to 8. Unless otherwise specified, in this specification, spatially relative terms such as 'upper', 'upper surface', 'lower', 'lower surface', and/or the like are based on the drawings, and in fact, depending on the direction in which the element is disposed, the terms may be modified. For example, the device may also be oriented in other ways (for example, turned over, and/or rotated 90 degrees and/or at other orientations), and the spatially relative terms used herein are to be interpreted accordingly.

Figure 1:
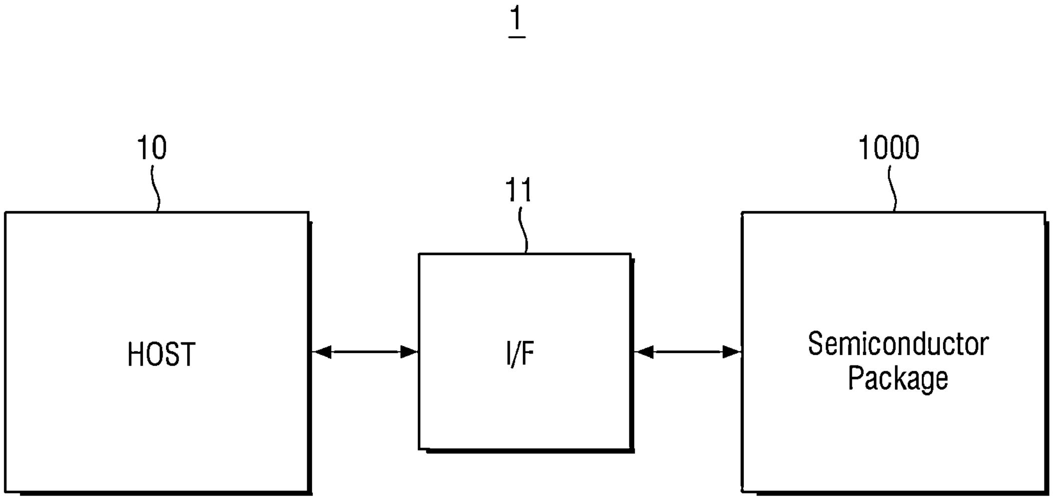
FIGS. 1 and 2 are diagrams for explaining an electronic device according to some embodiments.
Figure 2:
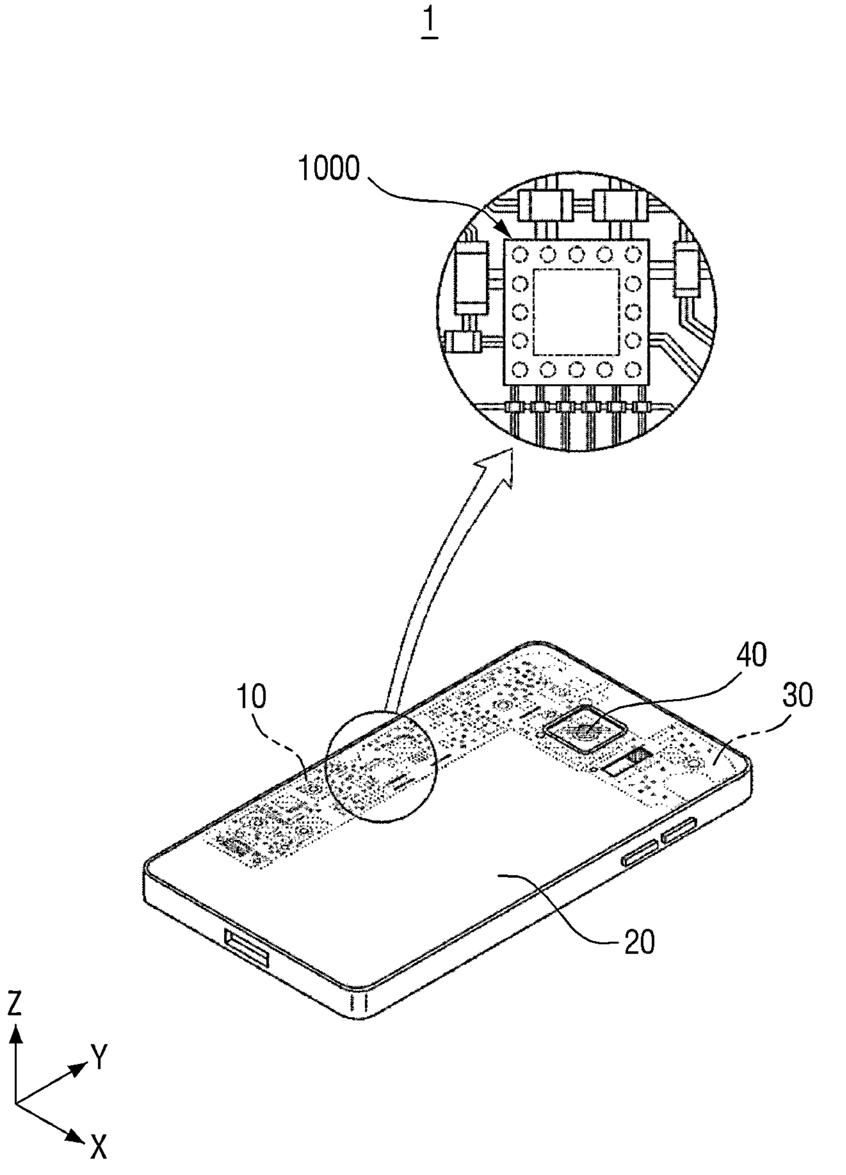
Figure 3:
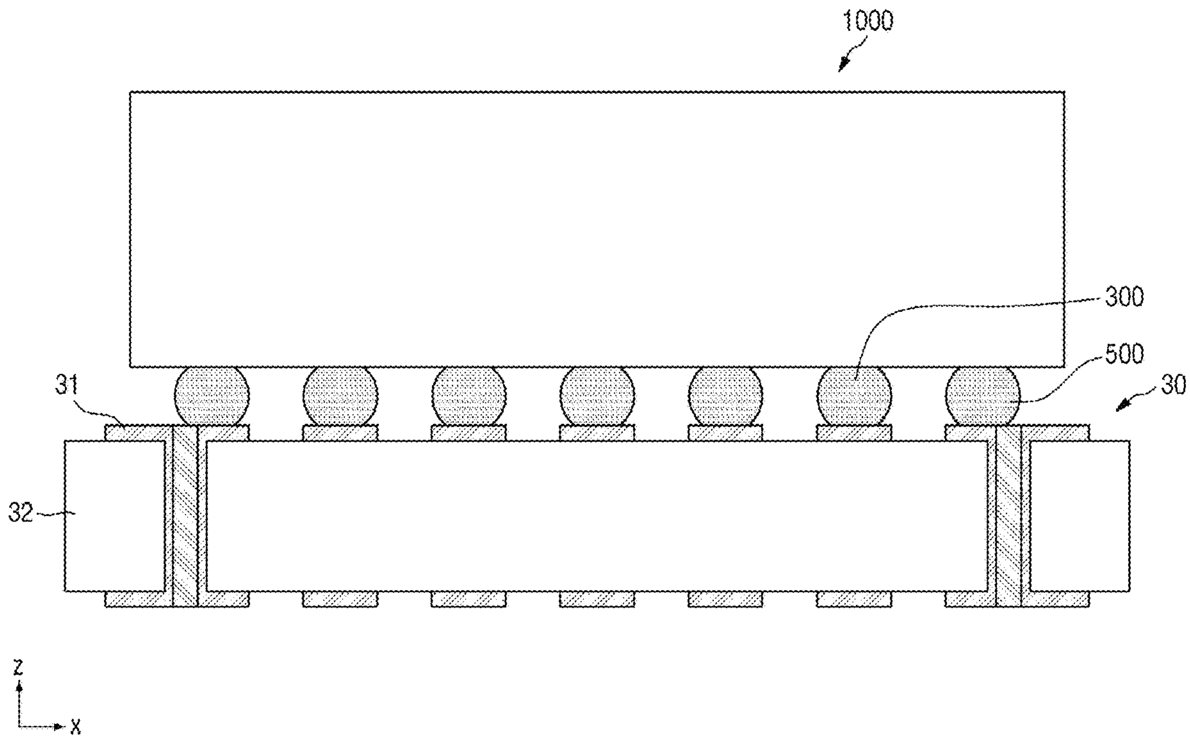
FIG. 3 is a diagram for explaining a semiconductor package and a main board of FIG. 2.
Figure 4:
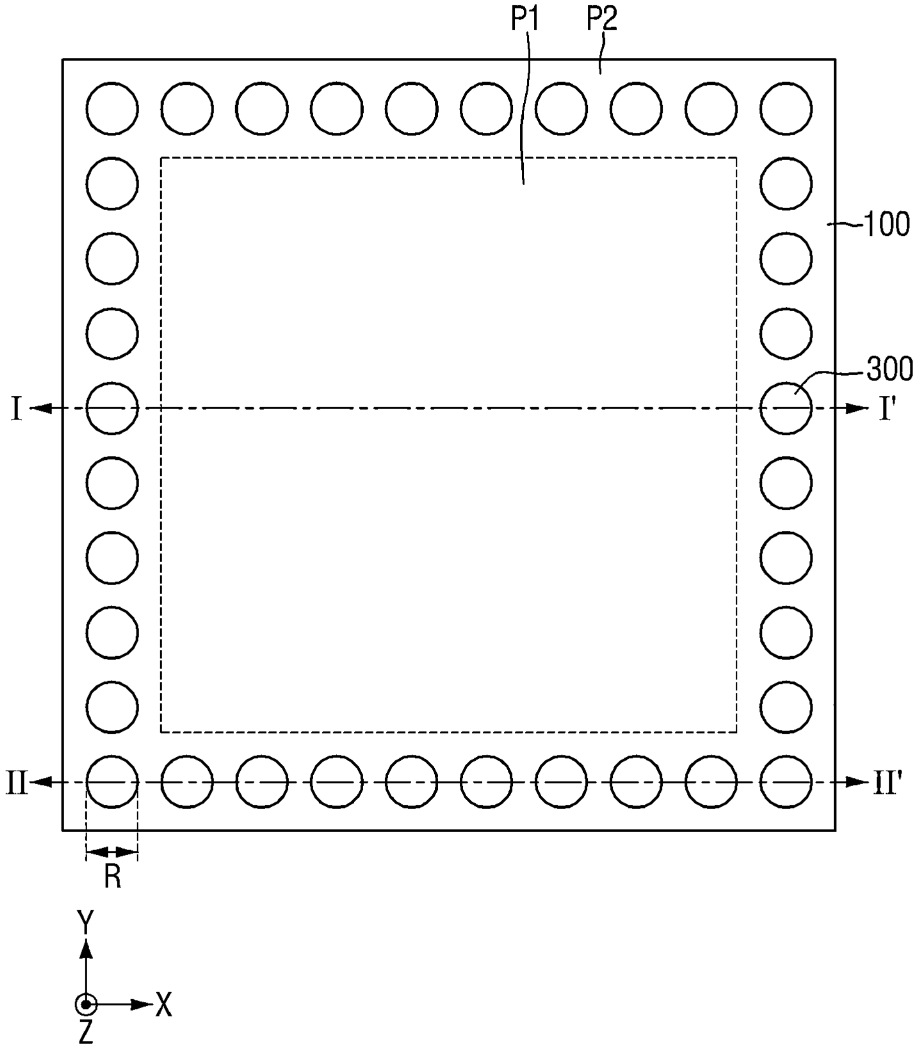
FIG. 4 is an example layout diagram of the semiconductor package according to some embodiments of FIG. 3.
Figure 5:
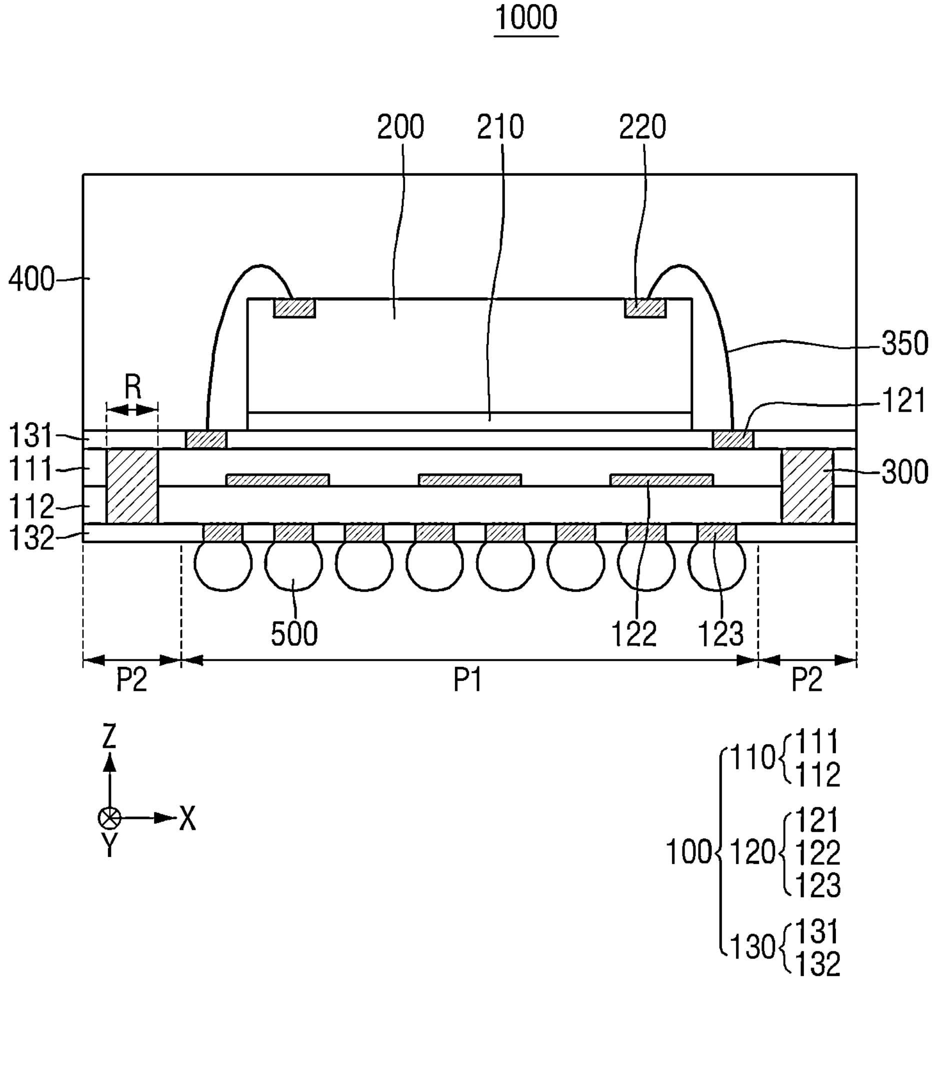
FIG. 5 is a schematic cross-sectional view of a semiconductor package according to some embodiments taken along I-I' of FIG. 4.
Figure 6:
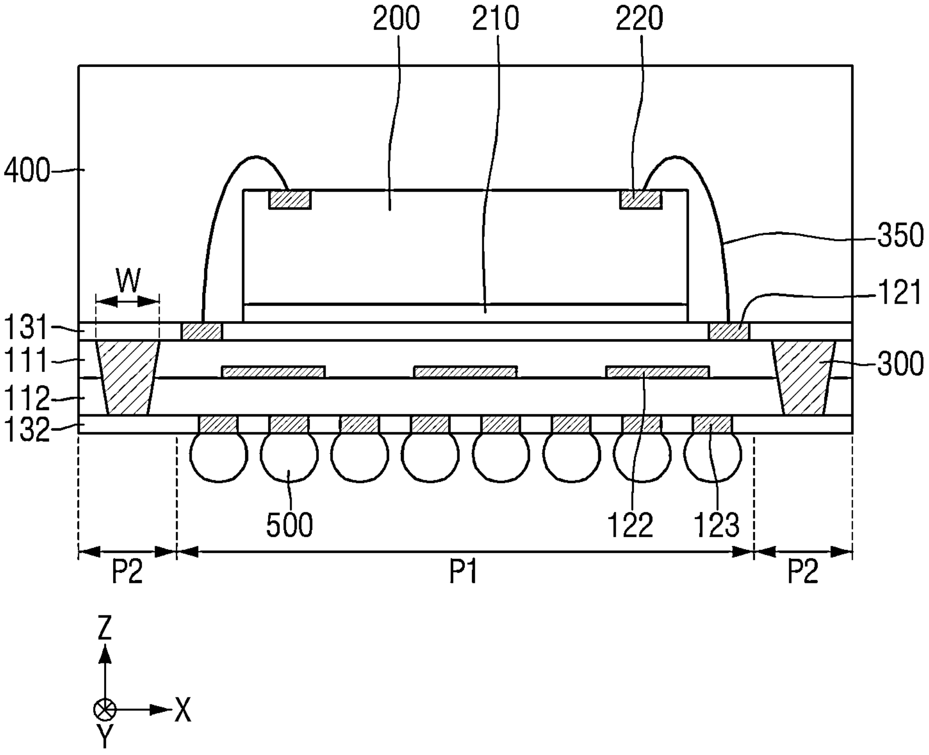
FIG. 6 is a schematic cross-sectional view of a semiconductor package according to some embodiments taken along I-I' of FIG. 4.
Figure 7:
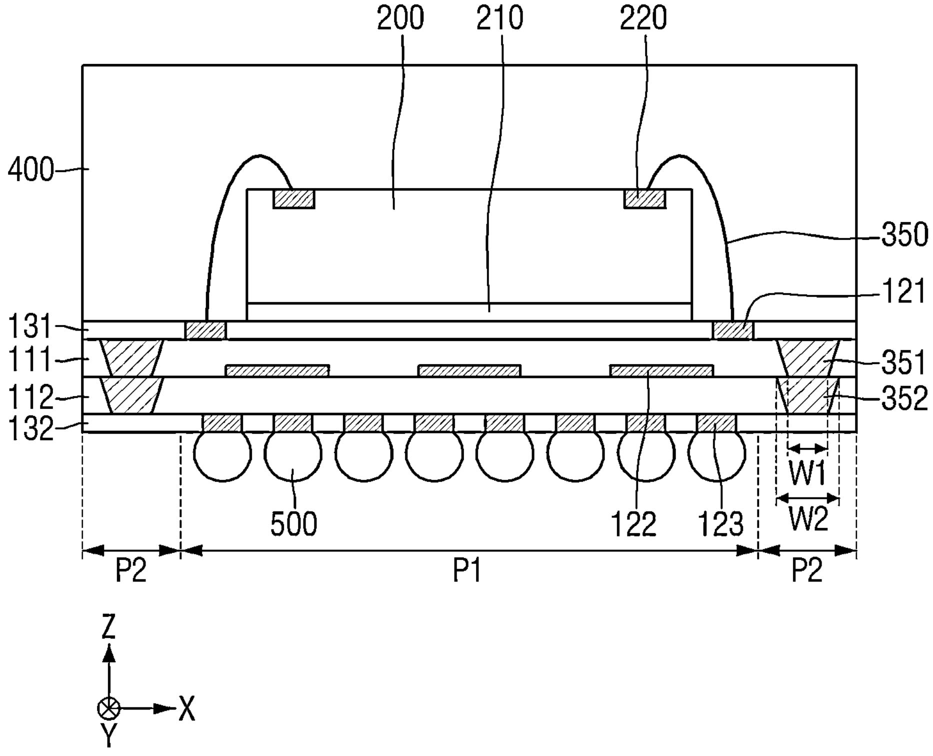
FIG. 7 is a schematic cross-sectional view of a semiconductor package according to some embodiments taken along I-I' of FIG. 4.
Figure 8:
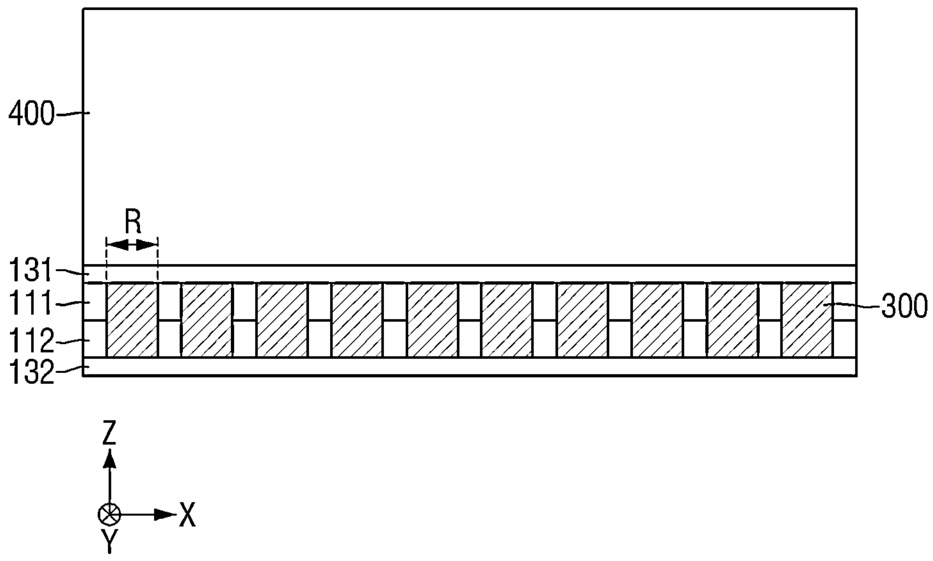
FIG. 8 is a schematic cross-sectional view of a semiconductor package according to some embodiments taken along II-II' of FIG. 4.

FIGS. 1 and 2 are diagrams for explaining an electronic device according to some embodiments. FIG. 3 is a diagram for explaining a semiconductor package and a main board of FIG. 2. FIG. 4 is an example layout diagram of the semiconductor package according to some embodiments of FIG. 3. FIG. 5 is a schematic cross-sectional view of a semiconductor package according to some embodiments taken along I-I' of FIG. 4. FIG. 6 is a schematic cross-sectional view of a semiconductor package according to some embodiments taken along I-I' of FIG. 4. FIG. 7 is a schematic cross-sectional view of a semiconductor package according to some embodiments taken along I-I' of FIG. 4. FIG. 8 is a schematic cross-sectional view of a semiconductor package according to some embodiments taken along II-II' of FIG. 4.

Referring to FIG. 1, an electronic device 1 may include a host 10, an interface 11, and a semiconductor package 1000.

In some embodiments, the host 10 may be connected to the semiconductor package 1000 through the interface 11. For example, the host 10 may transmit a signal to the semiconductor package 1000 to control the semiconductor package 1000. Further, for example, the host 10 may receive a signal from the semiconductor package 1000 and process the data included in the signal.

In some example embodiments, the host 10 may include a logic device such as a central processing unit (CPU), a controller, an application specific integrated circuit (ASIC), and/or the like. Further, the host 10 may include a memory chip, such as a DRAM (Dynamic Random Access Memory), a SRAM (Static RAM), PRAM (Phase-change RAM), a MRAM (Magneto resistive RAM), a FeRAM (Ferroelectric RAM), a RRAM (Resistive RAM), and/or the like.

Referring to FIGS. 1 and 2, the electronic device 1 may include a host 10, a body 20, a main board 30, a camera module 40, and a semiconductor package 1000.

The main board 30 may be mounted inside the body 20 of the electronic device 1. The host 10, the camera module 40, and the semiconductor package 1000 may be mounted on the main board 30. The host 10, the camera module 40, and the semiconductor package 1000 may be electrically connected by the main board 30. For example, the interface 11 may be implemented by (and/or in) the main board 30.

The host 10 and the semiconductor package 1000 may be electrically connected by the main board 30 to transmit and receive signals.

Referring to FIG. 3, the semiconductor package 1000 may be placed on the main board 30. For example, a connecting terminal 500 may be placed on the main board 30. The connection terminal 500 may include, for example, a plurality of solder bumps and/or pillars forming a plurality of connections. The main board 30 may be connected to the semiconductor package 1000 by the connecting terminal 500.

The main board 30 may be a printed circuit wiring structure (printed circuit board; PCB), a ceramic wiring structure, a glass wiring structure, an interposer wiring structure, and/or the like. However, the example embodiments are not limited thereto.

The main board 30 may include a wiring structure 31 and a core 32. The core 32 may include a CCL (Copper Clad Laminate), a prepreg (PPG), an integrated organic-inorganic film (e.g., Ajimoto Build-up Film (ABF)), epoxy, resin, polyimide, and/or the like. The wiring structure 31 may include, but is not limited to, at least one of copper (Cu), aluminum (Al), silver (Ag), tin (Sn), gold (Au), nickel (Ni), lead (Pb), titanium (Ti), alloys thereof, and/or the like.

The core 32 is placed at a central part of the main board 30, and the wiring structure 31 may be placed above and below the core 32. The wiring structure 31 may be placed to be exposed above and below the main board 30.

Further, the wiring structure 31 may penetrate the core 32. The wiring structure 31 may electrically connect elements that come into contact with the main board 30. For example, the wiring structure 31 may electrically connect the semiconductor package 1000 and the host 10, e.g., through the first connecting terminal 500.

Referring to FIGS. 4 and 5, the semiconductor package according to some embodiments includes a connecting structure 100, a semiconductor chip 200, and a mold layer 400.

The connecting structure 100 may be a wiring structure for packaging. For example, the connecting structure 100 may be a printed circuit wiring structure (PCB; printed circuit board), a ceramic wiring structure, and/or the like. The connecting structure 100 may be a wiring structure for a wafer level package fabricated at a wafer level. The connecting structure 100 may include a lower side and an upper side that are opposite to each other.

Referring to FIG. 4, the connecting structure 100 may each extend in a first direction X and a second direction Y intersecting the first direction X. The connecting structure 100 includes a first region P1 in which a connecting terminal 500 (to be described later) is placed, and a second region P2 outside the first region P1. A semiconductor chip 200 (to be described later) may be formed (and/or disposed) in the first region P1. The second region P2 may be formed to surround the first region P1.

Referring to FIGS. 4 and 5, the connecting structure 100 includes an insulating layer 110 and a wiring layer 120. The insulating layer 110 may include a first insulating layer 111 and a second insulating layer 112 placed between the semiconductor chip 200 and the connecting terminal 500. The first insulating layer 111 and the second insulating layer 112 may be formed at the uppermost part and the lowermost part of the insulating layer 110, respectively.

The wiring layer 120 may include a plurality of pads (e.g., first to third pads 121, 122 and 123) of at least one layer placed between the semiconductor chip 200 and the connecting terminal 500, and at least one via that connects the first to third pads 121, 122 and 123.

In some embodiments, although the insulating layer 110 and the wiring layer 120 of the connecting structure 100 are each, respectively, shown as two layers and three layers, this is for convenience of explanation, and the number of layers of the insulating layer 110 and the wiring layer 120 is not limited thereto.

The insulating layer 110 of the connecting structure 100 may include, for example, a printed circuit board (PCB) and/or a ceramic substrate. However, the example embodiments are not limited thereto.

When the insulating layer 110 is a printed circuit board, the insulating layer 110 may be made of at least one material selected from phenol resin, epoxy resin, polyimide, and/or the like. For example, the insulating layer 110 may include at least one material selected from an integrated organic-inorganic film (e.g., ABF), FR-4 (flame retardant 4), tetrafunctional epoxy, polyphenylene ether, epoxy/polyphenylene oxide, BT (bismaleimide triazine), thermount, cyanate ester, polyimide, liquid crystal polymer, and/or the like.

The connecting structure 100 may further include a passivation layer 130 formed at the uppermost part and the lowermost part of the insulating layer 110. The passivation layer 130 may cover at least a part of the first and second insulating layers 111 and 112 and the first and second pads 121 and 122. The passivation layer 130 may include a first passivation layer 131 placed at the uppermost part of the insulating layer 110, and a second passivation layer 132 placed at the lowermost part of the insulating layer 110.

The first passivation layer 131 is placed above the first insulating layer 111 and may expose the first pad 121, and the second passivation layer 132 is placed below the second insulating layer 112 and may expose the third pad 123.

The passivation layer 130 may be a solder resist. However, the technical idea of the present invention is not limited thereto. The passivation layer 130 may include, for example, but is not limited to, a photosensitive insulating material (photoimageable dielectric; PID).

The first to third pads 121, 122 and 123 may include a conductive material, for example, but is not limited to, copper (Cu), nickel (Ni), palladium (Pd), platinum (Pt), gold (Au), cobalt (Co), an alloy thereof, and/or the like.

One surface of the semiconductor chip 200 may be placed on one side of the connecting structure 100. For example, the semiconductor chip 200 may be placed on the connecting structure 100. In this case, the semiconductor chip 200 may be mounted on the upper surface of the connecting structure 100.

The semiconductor chip 200 may include an integrated circuit (IC) in which hundreds to millions (and/or more) of semiconductor elements are integrated inside a single chip. For example, the semiconductor chip 200 may be, but is not limited to, a processor such as an application processor (AP), a CPU (Central Processing Unit), a GPU (Graphic Processing Unit), an FPGA (Field-Programmable Gate Array), a digital signal processor, an encryption processor, a microprocessor, a micro controller. and/or the like. For example, the semiconductor chip 200 may be (and/or include) a logic chip (such as an ADC (Analog-Digital Converter), an ASIC (Application-Specific IC), and/or the like), and may be (and/or include) a memory chip such as a volatile memory (e.g., a DRAM) or a non-volatile memory (e.g., a ROM or a flash memory). In some example embodiments, the semiconductor chip 200 may be (and/or include) a combination of these elements.

Although only one semiconductor chip 200 is shown as being formed on the connecting structure 100, this is merely for convenience of explanation. For example, a plurality of semiconductor chips 200 may be on the connecting structure 100. The plurality of semiconductor chips 200 may be side by side and/or may be sequentially stacked on the connecting structure 100.

In some embodiments, the semiconductor chip 200 may be mounted on the connecting structure 100 by a wire bonding method. For example, at least one of the connecting pads 220 may be formed on a second surface of the semiconductor chip 200. The connecting pad 220 on the second surface may electrically connect the connecting structure 100 and the semiconductor chip 200 through a wire 350. At least one first pads 121 may be formed between the upper surface of the connecting structure 100 and the lower surface of the semiconductor chip 200. The first pad 121 may electrically connect the connecting structure 100 and the semiconductor chip 200 through the wire 350.

The semiconductor chip 200 and the connecting structure 100 may be fixed to each other by the adhesive layer 210. The adhesive layer 210 may be, for example, but is not limited to, a DAF (Die Adhesive Film).

A through via 300 penetrates at least a part of the connecting structure 100. An upper surface and a lower surface of the through via 300 come into contact with the upper surface and the lower surface of the insulating layer 110, respectively. The upper surface of the through via 300 comes into contact with the upper surface of the first insulating layer 111, and the lower surface of the through via 300 comes into contact with the lower surface of the second insulating layer 112. For example, the through via 300 may be formed to penetrate only the first and second insulating layers 111 and 112 and not to penetrate the first and second passivation layers 131 and 132.

In some example embodiments, the through via 300 does not come into contact with a mold layer 400 (to be described below). For example, the through via 300 is spaced apart from the mold layer 400 with the passivation layer 130 interposed therebetween. The through via 300 may be, for example, spaced apart from the semiconductor chip 200 and the mold layer 400 in a third direction Z which intersects the first and second directions X and Y with the first passivation layer 131 interposed therebetween. The through via 300 may also be spaced apart from the connecting terminal 500 in the third direction Z with the second passivation layer 132 interposed therebetween.

The through via 300 is not electrically connected to the semiconductor chip 200 and the connecting terminal 500. The through via 300 is not electrically connected to the first pad 121 and the third pad 123.

Referring to FIG. 4, the through via 300 is placed in the second region P2. A plurality of through vias 300 may be placed side by side and formed in the first direction X and the second direction Y in which the connecting structure 100 extends. The plurality of through vias 300 may form a row along the outside of the connecting structure 100 and may be continuously placed. The widths of the plurality of through vias 300 may be the same as each other. For example, diameters R of the upper surfaces of the plurality of through vias 300 may be the same as each other. For example, the diameters R of each of the plurality of through vias 300 may be 50 μm or more. However, the example embodiments are not limited thereto.

The plurality of through vias 300 may be spaced apart from each other in the first direction X and the second direction Y with the insulating layer 110 interposed therebetween. A plurality of through vias 300 may be spaced apart from each other in the first direction X and the second direction Y by a distance smaller than a distance corresponding to the diameter R of the upper surface of the through vias 300.

Each of the side surfaces of the plurality of through vias 300 may be spaced apart from the outer peripheral surface of the connecting structure 100 in the first direction X and the second direction Y.

The through via 300 may be placed in the second region P2 but may not be placed in the first region P1. Referring to FIG. 8, the semiconductor chip 200 may not be placed in the second region, P2, and therefore not above the through via 300 in the second region P2. That is, in the second region P2, the mold layer 400 may be placed above the through via 300 and the semiconductor chip 200 may not be placed above the through via 300.

Further, in the second region P2, the through via 300 may not be electrically connected to the connecting terminal 500, and/or the connecting terminal 500 may not be placed below the through via 300. For example, in the second region P2, the passivation layer 130 may be placed below the through via 300, and the third pad 123 may not be placed. Further, in the second region P2, the through via 300 may not be electrically connected to the semiconductor chip 200. For example, in the second region P2, the passivation layer 130 may be placed and the first pad 121 may not be placed above the through via 300.

The thickness of semiconductor package substrate gradually decreases with the trend toward the miniaturization of electronic components. Therefore, there is an increasing need for controlling warpage of the semiconductor package substrate. According to some embodiments, the through via 300 for controlling and/or reducing warpage of the substrate may be formed, by utilizing a region between the region in which the outermost connecting terminal 500 is placed and the outer peripheral surface of the connecting structure 100, in the connecting structure 100.

According to some embodiments, it is possible to provide a semiconductor package in which the rigidity of the outer region of the substrate for the semiconductor package is particularly uniformly improved, by forming a plurality of through vias 300 continuously placed along the outside of the connecting structure 100.

Referring to FIG. 5, the widths R of the upper surface and the lower surface of the through via 300 may the same as each other. For example, the shape of the through via 300 may be cylindrical. In these cases, it is possible to provide a semiconductor package in which the rigidity of the outer region is improved more uniformly.

Referring to FIG. 6, the width W of the through via 300 may become narrower toward the lower part of the connecting structure 100. In these cases, the width of the upper surface of the through via 300 may be greater than the width of the lower surface. The shape of the through via 300 may be formed in a tapered shape. For example, the shape of the through via 400 may be conical.

Although not specifically shown, a through hole may be formed using a laser (and/or the like) to integrally penetrate the first and second insulating layers 111 and 112, and the through hole may be filled with a conductive material to form the through via 300. Here, the conductive material may include, but is not limited to, copper (Cu). After that, the first and second passivation layers 131 and 132 may be formed on the first and second insulating layers 111 and 112 on which the through via 300 is formed, respectively.

Referring to FIG. 7, the through via 300 may include a plurality of through vias (e.g., an upper through via 351 penetrating the first insulating layer 111 and a lower through via 352 which is placed below the upper through via 351 and penetrates the second insulating layer 112). In this case, a width W2 of the upper surface of the lower through via 352 may be greater than a width W1 of the lower surface of the upper through via 351. Each of the shapes of the upper and lower through vias 351 and 352 may be formed in a tapered shape.

Although not specifically shown, in these cases, the upper and lower through holes may be separately formed, using a laser (and/or the like) to penetrate each of the first and second insulating layers 111 and 112, and the upper and lower through holes may be filled with a conductive material to form upper and lower through vias 351 and 352. After that, the first and second passivation layers 131 and 132 may each be formed on the first and second insulating layers 111 and 112 on which the upper and lower through vias 351 and 352 are formed.

The mold layer 400 covers the upper surface and the side surface of the semiconductor chip 200. The mold layer 400 may include, for example, an insulating material such as an insulating polymer material (such as EMC (epoxy molding compound)), a thermosetting resin (such as an epoxy resin), a thermoplastic resin (such as polyimide), and/or a resin in which a reinforcing material such as a filler is included in these elements (such as ABF, FR-4, BT resin and/pr the like).

The filler may utilize at least one or more selected from a group including silica ($SiO_2$), alumina ($Al_2O_3$), silicon carbide (SiC), barium sulfate ($BaSO_4$), talc, mud, mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), calcium zirconate ($CaZrO_3$), and/or the like. However, the material of the filler is not limited thereto.

The connecting terminal 500 may be formed on the lower surface of the connecting structure 100. In these cases, the connecting terminal 500 may be formed on the other side located on a side opposite to one side of the connecting structure 100. The connecting terminal 500 may be electrically connected to the third pad 123.

The shape of the connecting terminal 500 may be, for example, but is not limited to, a spherical shape, a pillar shape, and/or an elliptical spherical shape. The connection terminal 500 may include, for example, a metal, an alloy (e.g., a eutectic alloy), and/or solder. The connecting terminal 500 may include, for example, at least one of tin (Sn), indium (In), lead (Pb), zinc (Zn), nickel (Ni), gold (Au), silver (Ag), copper (Cu), antimony (Sb), bismuth (Bi), and/or an alloy thereof. However, the example embodiments are not limited thereto.

The connecting terminal 500 may electrically connect the connecting structure 100 to an external device. Accordingly, the connecting terminal 500 may provide an electric signal to the connecting structure 100, or may provide an electric signal, which is provided from the connecting structure 100, to an external device.

Hereinafter, a semiconductor package according to some embodiments of the present invention will be described referring to FIGS. 9 and 10. For convenience of explanation, differences from the semiconductor packages shown in FIGS. 1 to 8 will be mainly described.

Figure 9:
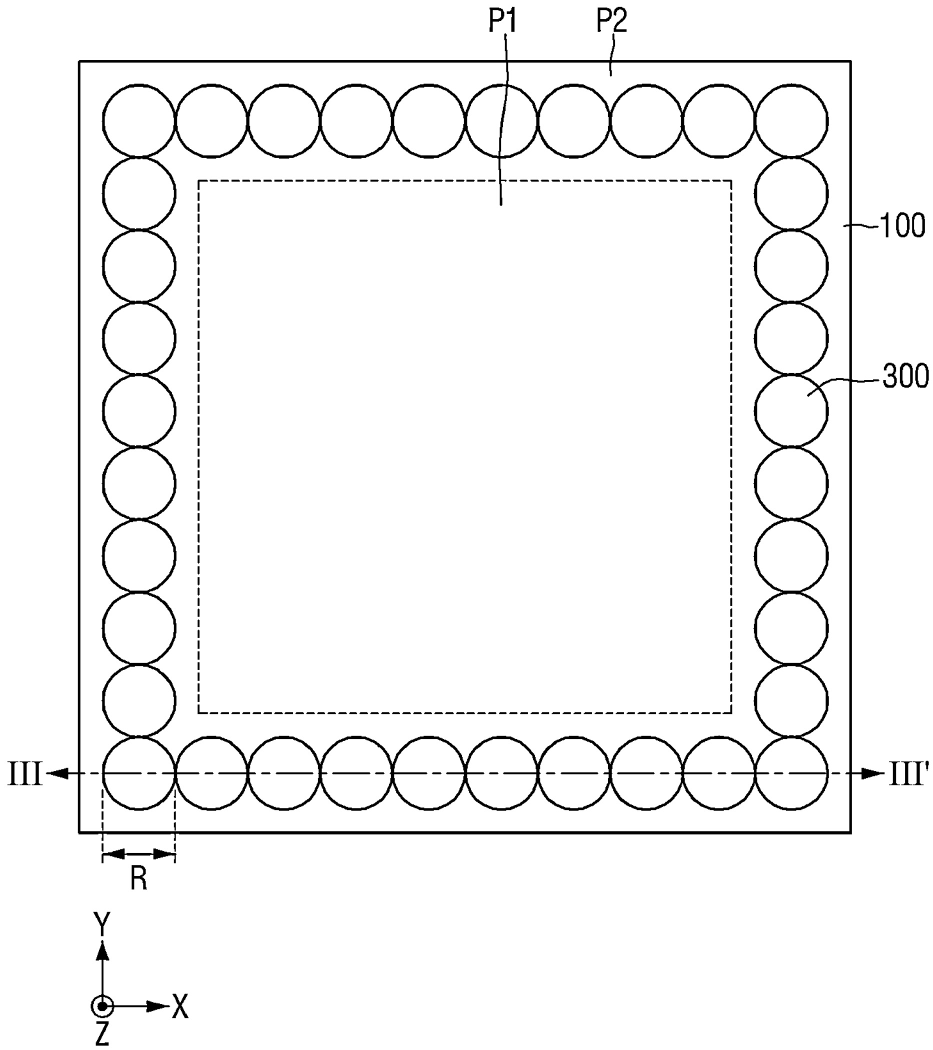
FIG. 9 is an example layout of a semiconductor package according to some embodiments of FIG. 3.

FIG. 9 is an example layout of a semiconductor package according to some embodiments of FIG. 3. FIG. 10 is a schematic cross-sectional view of a semiconductor package according to some embodiments taken along of FIG. 9.

Referring to FIG. 9, the plurality of through vias 300 may be placed in the second region P2 and may contact with each other in the first direction X and the second direction Y with the insulating layer 110 interposed therebetween. Each of the side surfaces of the plurality of through vias 300 adjacent to each other may come into contact with each other in the first direction X and the second direction Y. In these cases, the upper surfaces of the plurality of through vias 300 adjacent to each other may have a shape that is similar to the number 8.

Figure 10:
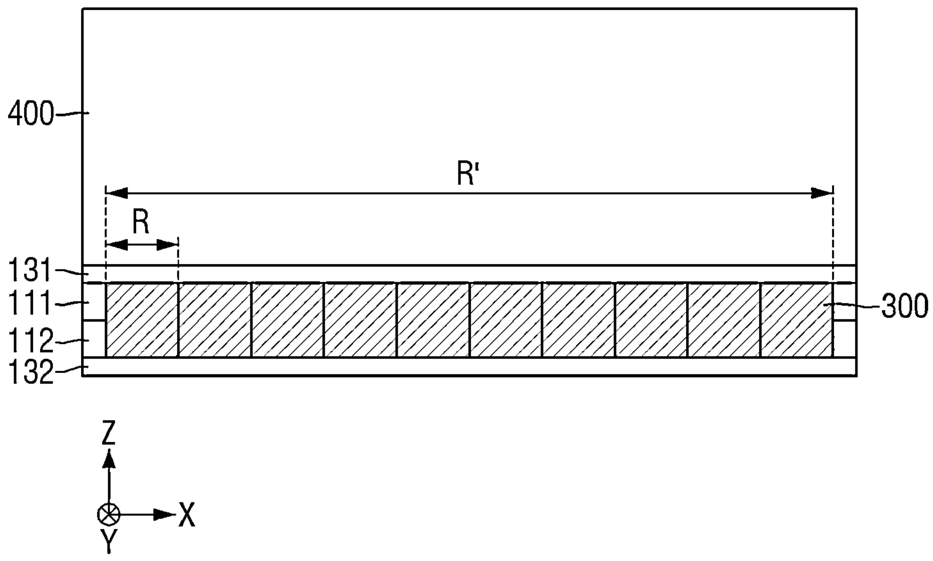
FIG. 10 is a schematic cross-sectional view of a semiconductor package according to some embodiments taken along of FIG. 9.

Referring to FIG. 10, among the plurality of through vias 300, the side surface of the through via 300 placed in an outermost part of the connecting structure 100 (e.g., an edge region) may be spaced apart from the outer peripheral surface of the connecting structure 100 in the first direction X and the second direction Y. For example, each of the side surfaces of the plurality of through vias 300 adjacent to each other may come into contact with each other in the first direction X and the second direction Y, except for the through via 300 placed on the outermost part of the connecting structure 100 among the plurality of through vias 300.

Referring to FIGS. 9 and 10, a diameter R' of the entire upper surfaces of the plurality of through vias 300 adjacent to each other in the first direction X or the second direction Y may be the same as the sum of the diameters R of each of the upper surfaces of the plurality of through vias 300.

Hereinafter, the semiconductor package according to some embodiments of the present invention will be described referring to FIGS. 11 to 14. For convenience of explanation, differences from the semiconductor packages shown in FIGS. 1 to 8 will be mainly described.

Figure 11:
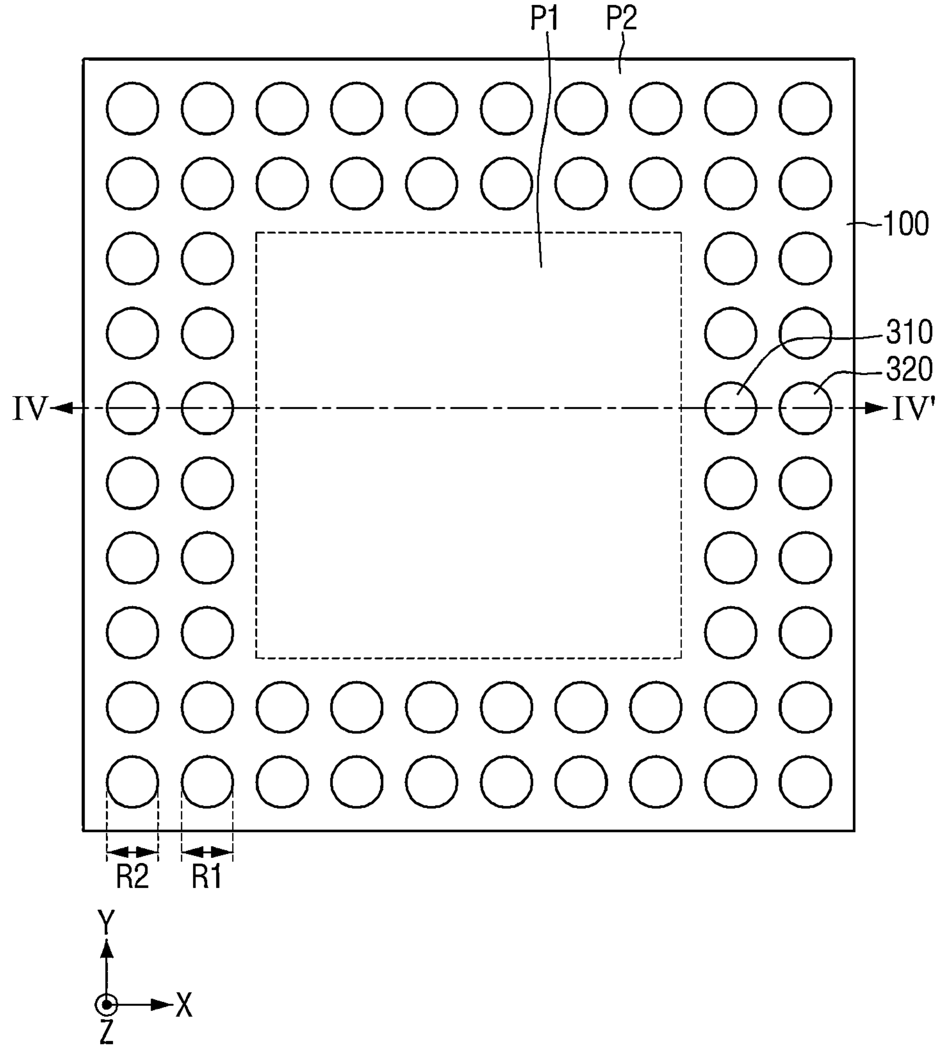
FIG. 11 is an example layout diagram of the semiconductor package according to some embodiments of FIG. 3.
Figure 12:
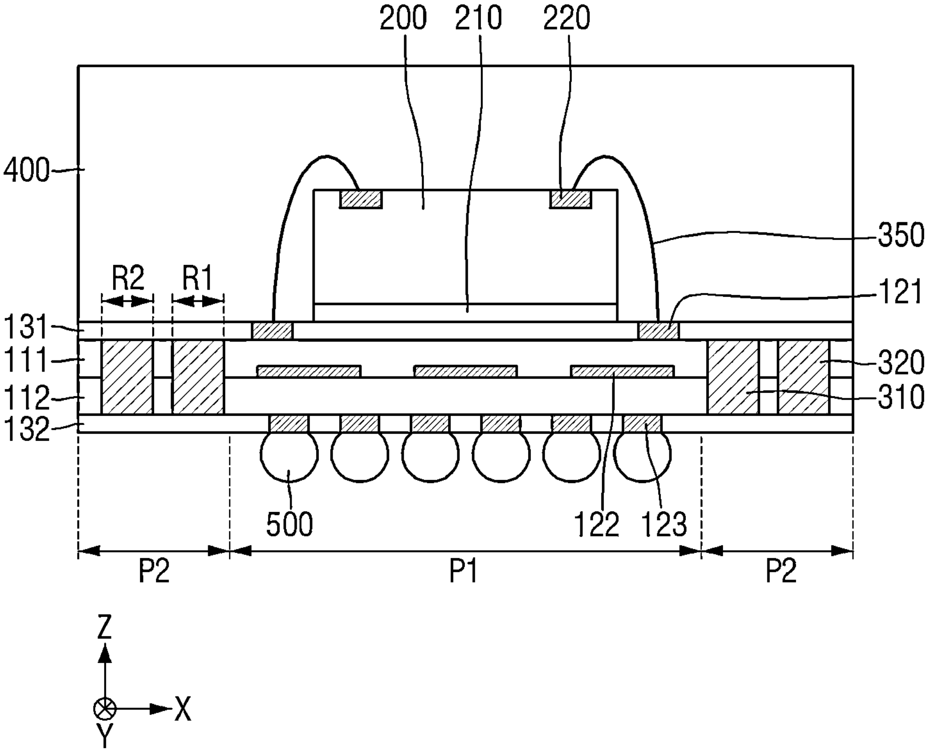
FIG. 12 is a schematic cross-sectional view of the semiconductor package according to some embodiments taken along IV-IV' of FIG. 11.
Figure 13:
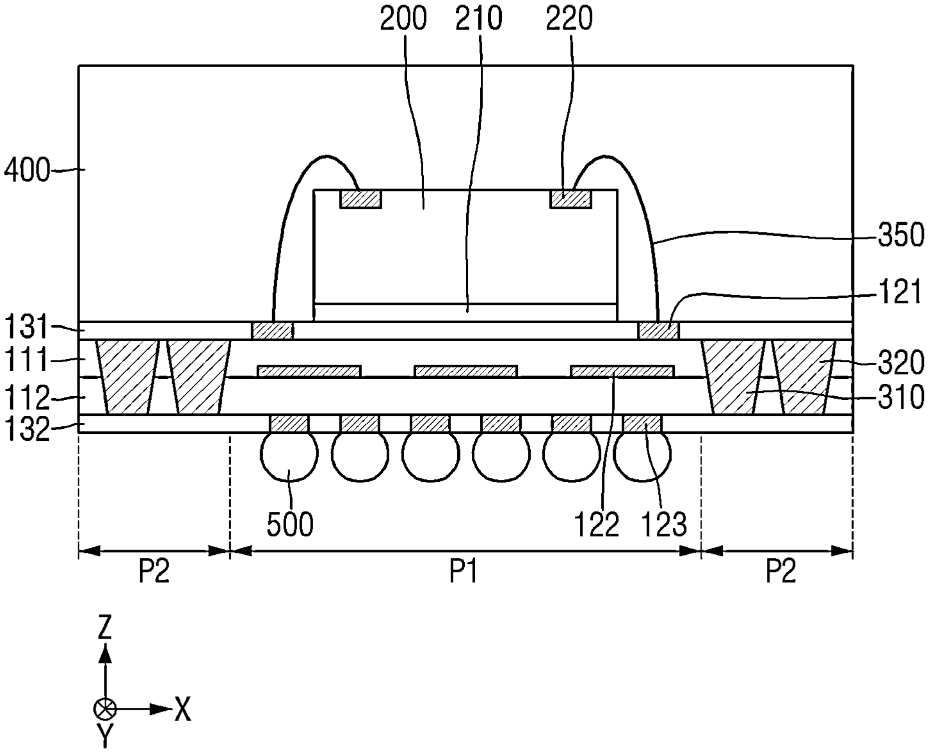
FIG. 13 is a schematic cross-sectional view of the semiconductor package according to some embodiments taken along IV-IV' of FIG. 11.
Figure 14:
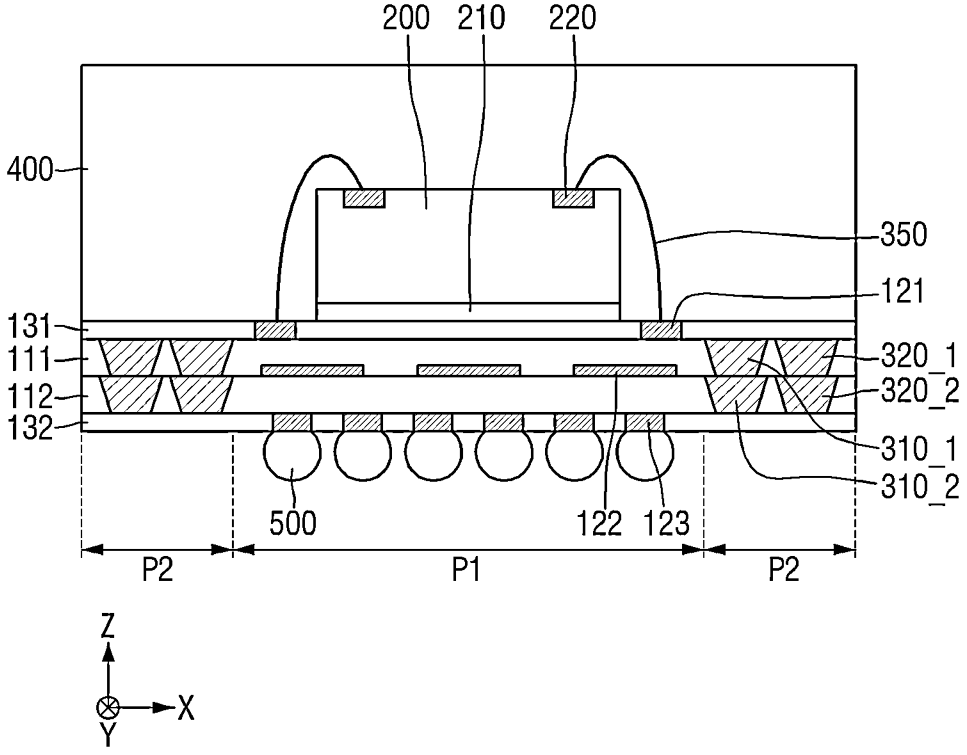
FIG. 14 is a schematic cross-sectional view of a semiconductor package according to some embodiments taken along IV-IV' of FIG. 1.

FIG. 11 is an example layout diagram of the semiconductor package according to some embodiments of FIG. 3. FIG. 12 is a schematic cross-sectional view of the semiconductor package according to some embodiments taken along IV-IV' of FIG. 11. FIG. 13 is a schematic cross-sectional view of the semiconductor package according to some embodiments taken along IV-IV' of FIG. 11. FIG. 14 is a schematic cross-sectional view of a semiconductor package according to some embodiments taken along IV-IV' of FIG. 11.

Referring to FIG. 11, the through via 300 includes a first through via 310 placed adjacent to the first region P1 in the second region P2, and a second through via 320 placed adjacent to the outside of the second region P2. The second through via 320 is placed around the first through via 310. The first and second through vias 310 and 320 are placed in the second region P2 and may not be placed in the first region P1. A plurality of the first and second through vias 310 and 320 may be placed side by side and formed in the first direction X and the second direction Y in which the connecting structure 100 extends. The first and second through vias 310 and 320 may form two rows along the outside of the connecting structure 100 and be placed continuously.

Specifically, the second through vias 320 are arranged to form a first row in the first direction X or the second direction Y along the outermost part of the connecting structure 100, that is, the edge. The first through vias 310 are placed to form a second row between the first row and the first region P1. In these cases, the first direction X in which the first row extends and the first direction X in which the second row extends may be aligned with each other. Additionally and/or alternatively, the second direction Y in which the first row extends and the second direction Y in which the second row extends may be aligned with each other.

The widths of the first and second through vias 310 and 320 may the same as each other. For example, the diameters R1 and R2 of each of the upper surfaces of the first and second through vias 310 and 320 may the same as each other.

Referring to FIG. 12, the connecting terminal 500 may not be placed below the first and second through vias 310 and 320. For example, the passivation layer 130 may be placed and the third pad 123 may not be placed below the first and second through vias 310 and 320 in the second region P2. The widths R1 and R2 of the upper and lower surfaces of each of the first and second through vias 310 and 320 may the same as each other.

Referring to FIG. 13, the widths of each of the first and second through vias 310 and 320 may become narrower toward the lower part of the connecting structure 100. In these cases, the width of the upper surface of each of the first and second through vias 310 and 320 may be larger than the width of the lower surface.

Referring to FIG. 14, the first through via 310 may include a first upper through via 310_1 penetrating the first insulating layer 111, and a first lower through via 310_2 which is placed below the first upper through via 310_1 and penetrates the second insulating layer 112. The second through via 320 may include a second upper through via 320_1 penetrating the first insulating layer 111, and a second lower through via 320_2 which is placed below the second upper through via 320_1 and penetrates the second insulating layer 112. In these cases, the widths of the upper surfaces of the first and second lower through vias 310_2 and 320_1 may be greater than the width of the lower surfaces of the first and second upper through vias 310_1 and 320_1.

Hereinafter, a semiconductor package according to some embodiments of the present invention will be described referring to FIGS. 15 to 16. For convenience of explanation, differences from the semiconductor packages shown in FIGS. 1 to 8 and 11 to 12 will be mainly described.

Figure 15:
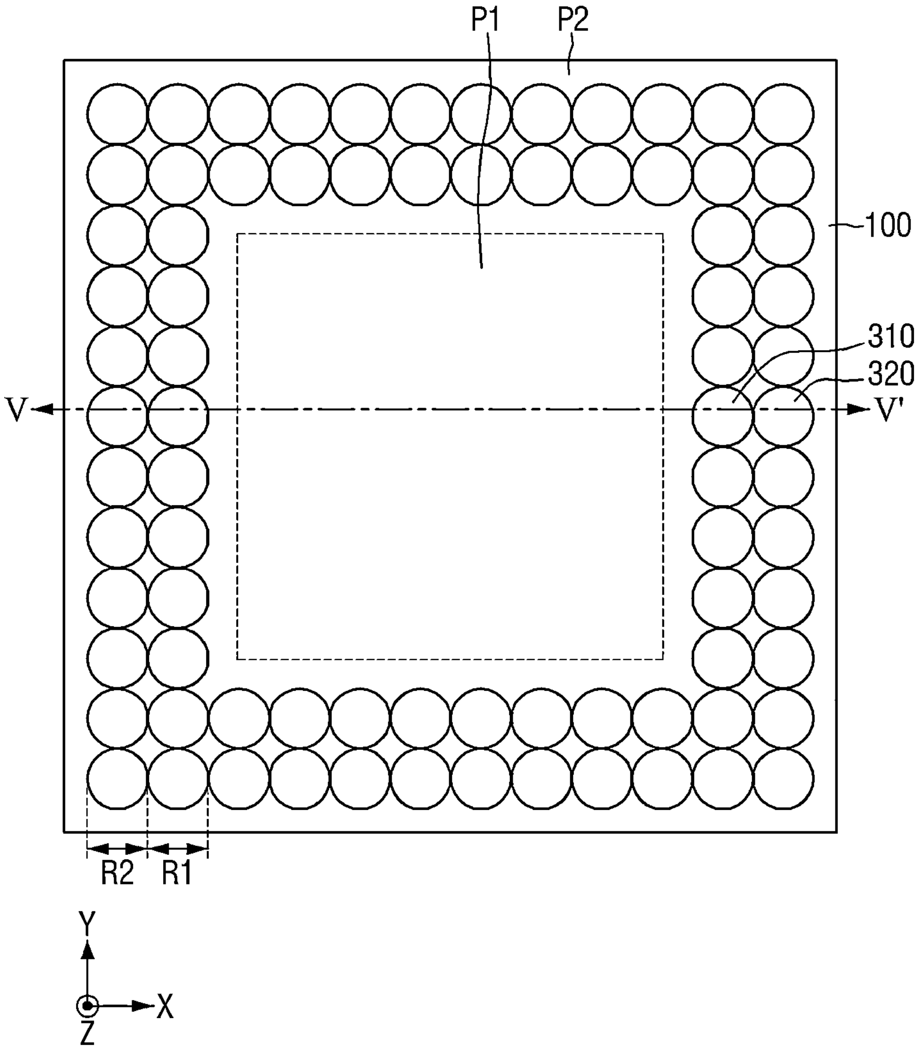
FIG. 15 is an example layout diagram of a semiconductor package according to some embodiments of FIG. 3.

FIG. 15 is an example layout diagram of a semiconductor package according to some embodiments of FIG. 3. FIG. 16 is a schematic cross-sectional view of a semiconductor package according to some embodiments taken along V-V' of FIG. 15.

Referring to FIG. 15, the through via 300 includes a first through via 310 which is placed to be closest to the first region P1 in the second region P2, and a second through via 320 which is placed to be closest to the outside of the second region P2. The first and second through vias 310 and 320 are placed in the second region P2 and may not be placed in the first region P1. A plurality of the first and second through vias 310 and 320 may be placed side by side and formed in the first direction X and the second direction Y in which the connecting structure 100 extends. The first and second through vias 310 and 320 may form two rows along the outside of the connecting structure 100 and be placed continuously.

The first and second through vias 310 and 320 may be placed to come into contact with each other in the first direction X and the second direction Y with the insulating layer 110 interposed therebetween. The side surfaces of the first and second through vias 310 and 320 adjacent to each other may come into contact with each other in the first direction X and the second direction Y, respectively. In these cases, the upper surfaces of the first and second through vias 310 and 320 adjacent to each other may form a figure of eight.

The widths of the first and second through vias 310 and 320 may the same as each other. For example, the diameters R1 and R2 of the upper surfaces of each of the first and second through vias 310 and 320 may the same as each other.

Figure 16:
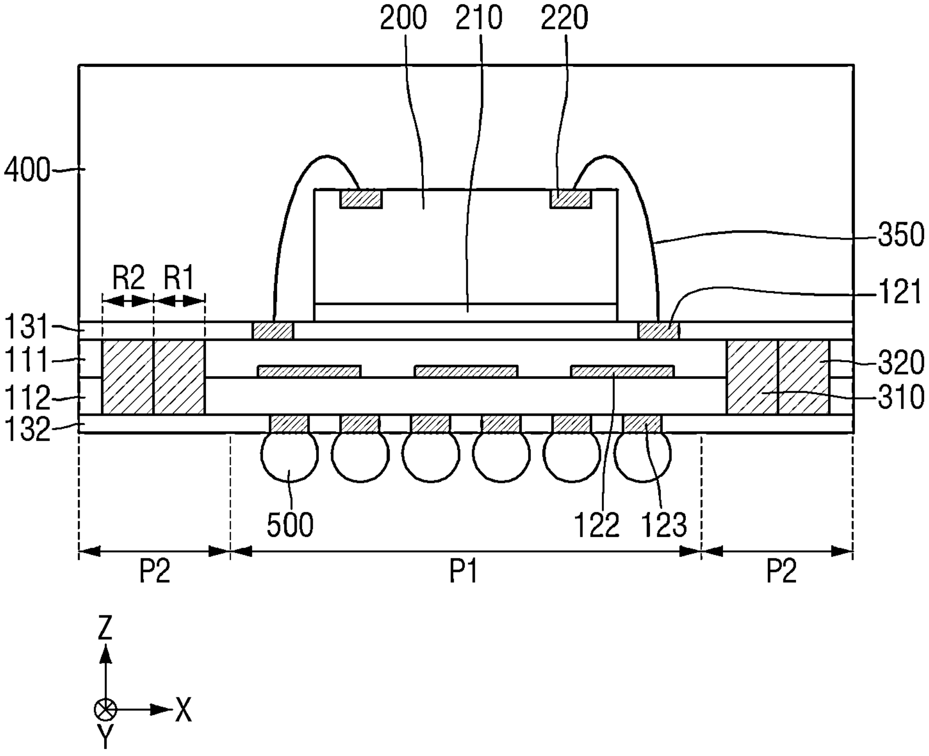
FIG. 16 is a schematic cross-sectional view of a semiconductor package according to some embodiments taken along V-V' of FIG. 15.

Referring to FIGS. 15 and 16, the side surface of the second through via 320 placed on the outermost part of the connecting structure 100 among the plurality of through vias 300 may be spaced apart from the outer peripheral surface of the connecting structure 100 in the first direction X and the second direction Y.

Hereinafter, a semiconductor package according to some embodiments of the present invention will be described referring to FIGS. 17 to 18. For convenience of explanation, differences from the semiconductor packages shown in FIGS. 1 to 8 will be mainly described.

Figure 17:
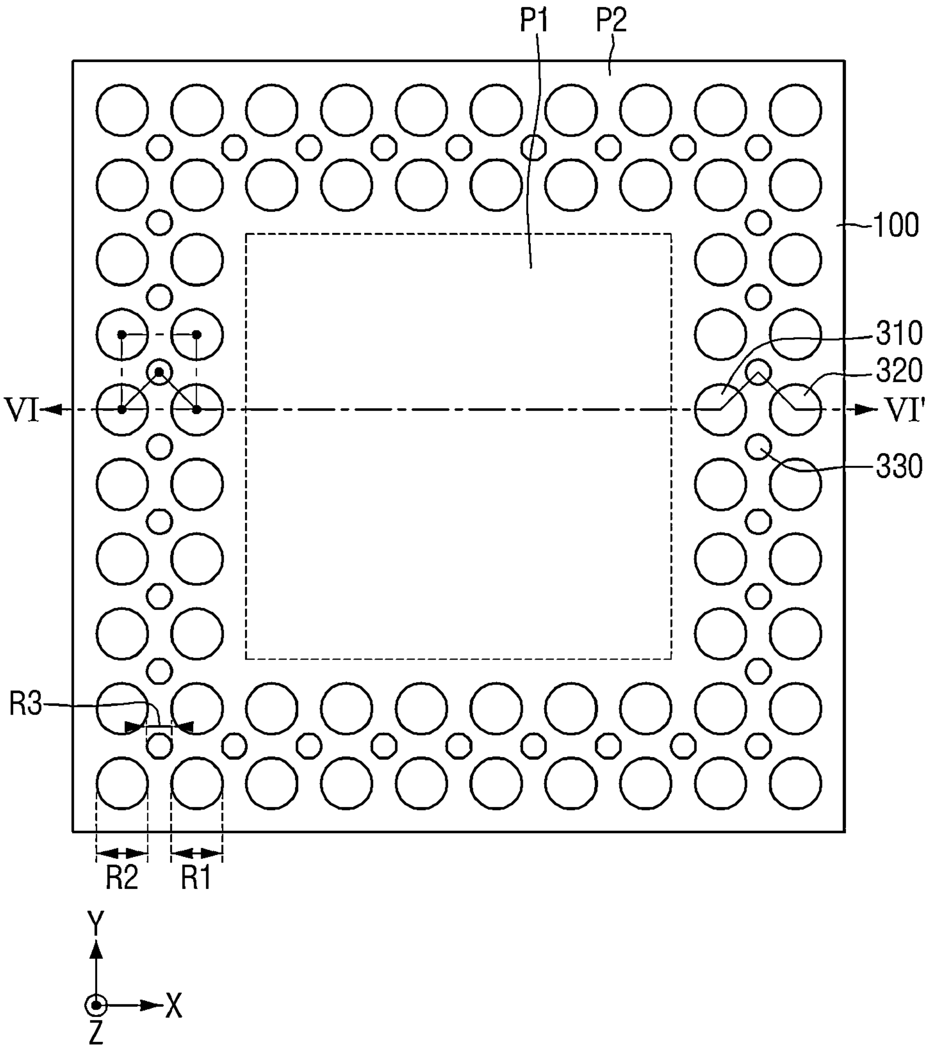
FIG. 17 is an example layout diagram of a semiconductor package according to some embodiments of FIG. 3.

FIG. 17 is an example layout diagram of a semiconductor package according to some embodiments of FIG. 3. FIG. 18 is a schematic cross-sectional view of a semiconductor package according to some embodiments taken along VI-VI' of FIG. 17.

Referring to FIG. 17, the through via 300 includes a plurality of first through via 310 placed adjacent to the first region P1 in the second region P2, and a plurality of second through via 320 placed adjacent to the outside of the second region P2. The plurality second through via 320 is placed around the plurality of first through via 310. The plurality of first and second through via 320 may surround a third through via 330. The first and second through vias 310 and 320 are placed in the second region P2. A plurality of the first and second through vias 310 and 320 may be placed side by side and formed in the first direction X and the second direction Y in which the connecting structure 100 extends.

Figure 18:
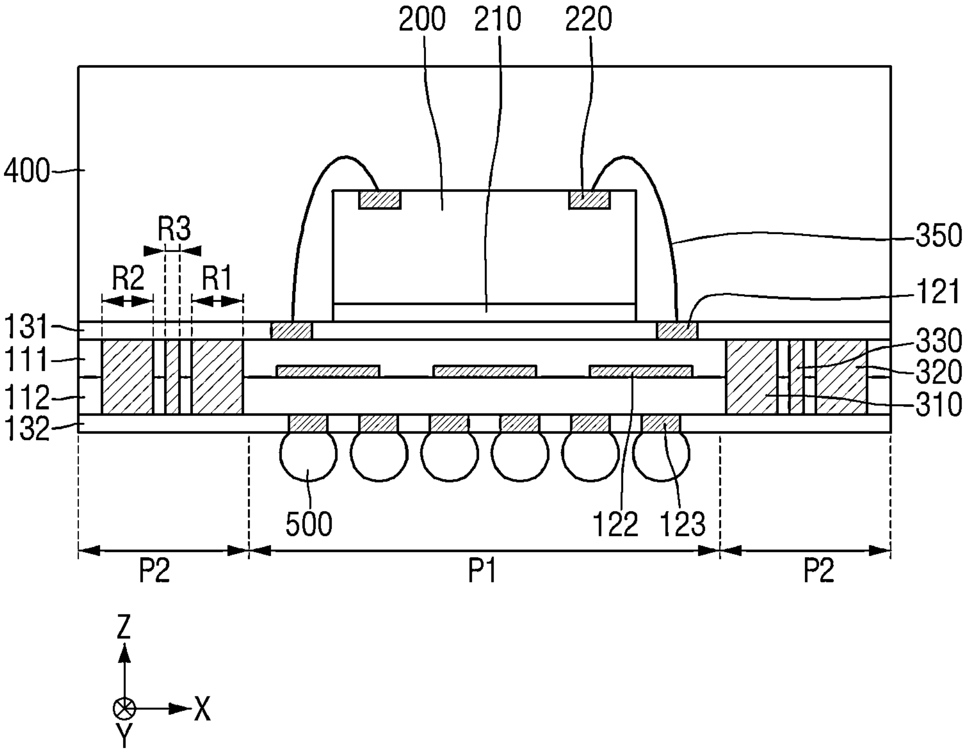
FIG. 18 is a schematic cross-sectional view of a semiconductor package according to some embodiments taken along VI-VI' of FIG. 17.

Referring to FIGS. 17 and 18, the through via 300 further includes the third through via 330 that is smaller than the widths of the first and second through vias 310 and 320. For example, diameters R1 and R2 of the upper surfaces of each of the first and second through vias 310 and 320 are the same as each other, and a diameter R3 of the upper surface of the third through via 330 may be smaller than the diameters R1 and R2 of the upper surfaces of each of the first and second through vias 310 and 320.

The third through via 330 is spaced apart from the first and second through vias 310 and 320 between them. The first to third through vias 310, 320, and 330 may be spaced apart from each other in the first direction X and the second direction Y with the insulating layer 110 interposed therebetween.

For example, the plurality of through vias 300 may include two second through vias 320 that are closest to each other among the plurality of second through vias 320 arranged to form part of the first row, and two first through vias 310 that are closest to each other among the plurality of first through vias 310 arranged to form part of the second row. The third through via 330 may be placed inside a virtual square that connects the centers of each of the two second through vias 320 and the two first through vias 310.

Hereinafter, a semiconductor package according to some embodiments of the present invention will be described referring to FIGS. 19 to 20. For convenience of explanation, differences from the semiconductor packages shown in FIGS. 1 to 8 will be mainly described.

Figure 19:
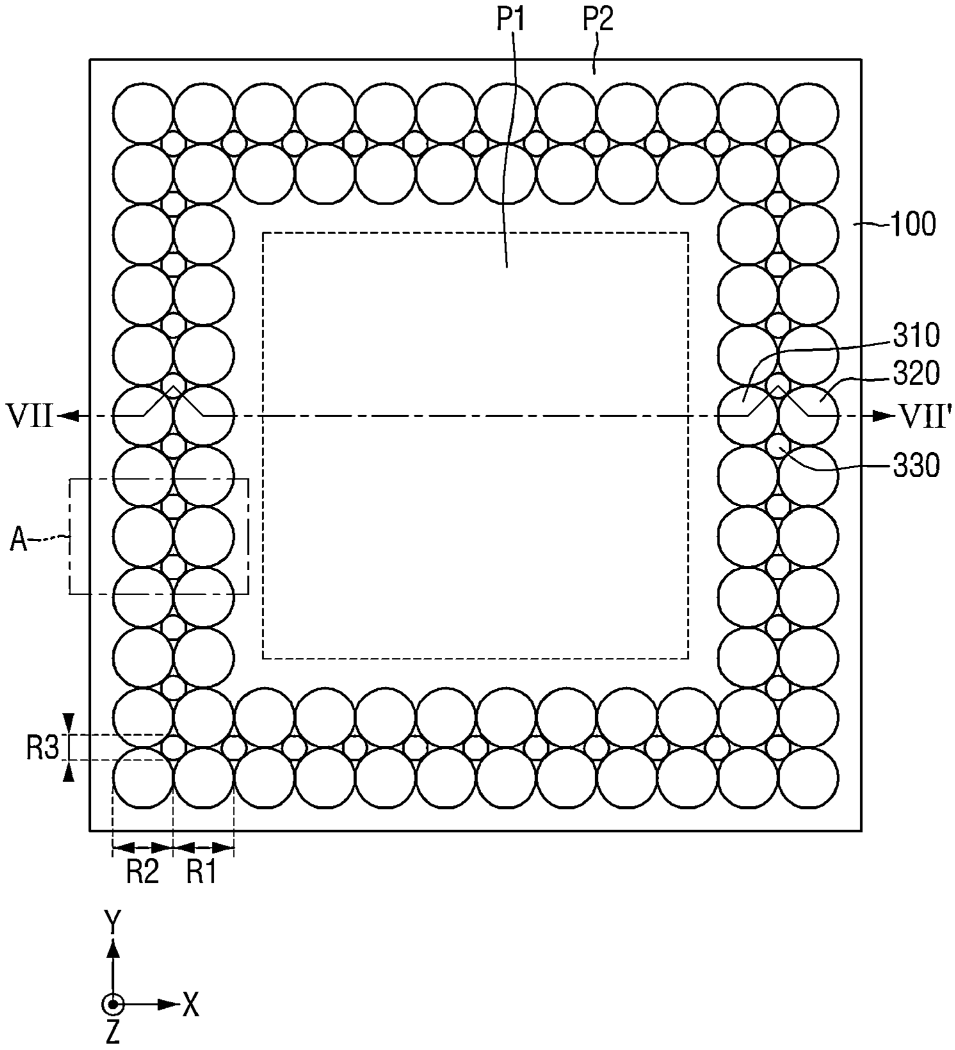
FIG. 19 is an example layout diagram of a semiconductor package according to some embodiments of FIG. 3.
Figure 20:
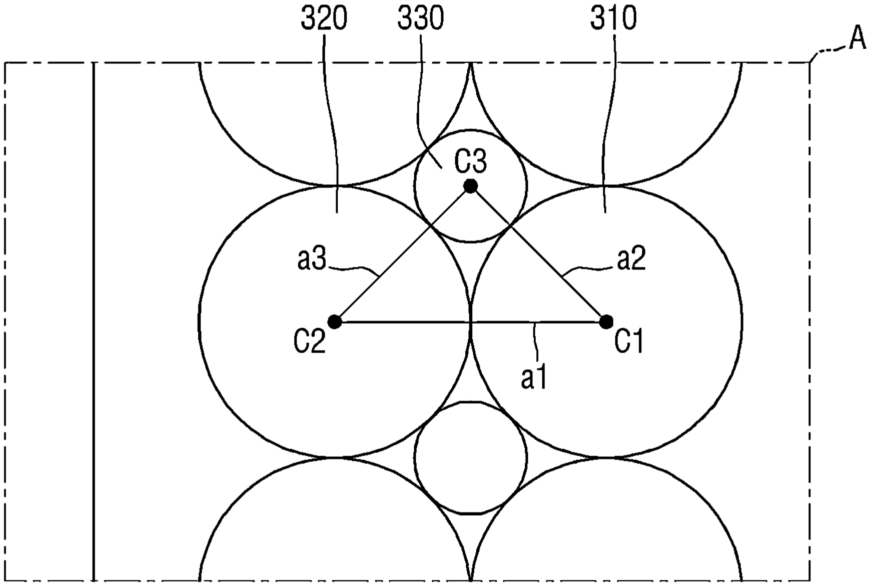
FIG. 20 is an enlarged view of a region A of FIG. 19.
Figure 21:
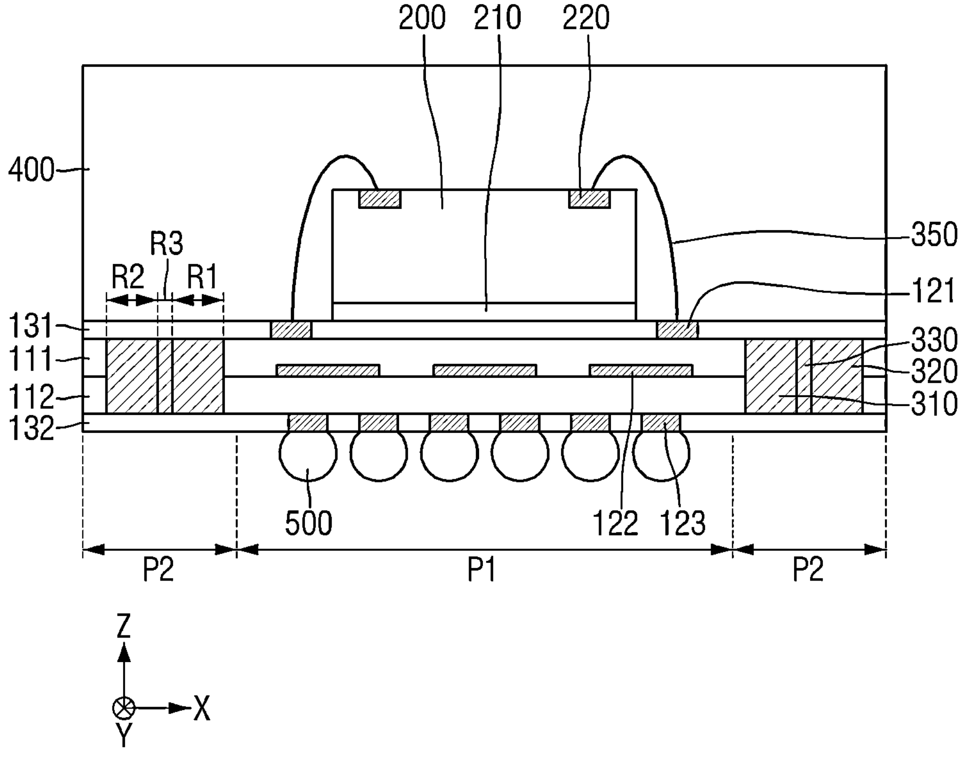
FIG. 21 is a schematic cross-sectional view of a semiconductor package according to some embodiments taken along VII-VII' of FIG. 19.

FIG. 19 is an example layout diagram of a semiconductor package according to some embodiments of FIG. 3. FIG. 20 is an enlarged view of a region A of FIG. 19. FIG. 21 is a schematic cross-sectional view of a semiconductor package according to some embodiments taken along VII-VII' of FIG. 19.

Referring to FIG. 19, the through via 300 includes a plurality of first through via 310 placed to be closest to the first region P1 in the second region P2, and a plurality of second through via 320 placed to be closest to the outside of the second region P2. The first and second through vias 310 and 320 are placed in the second region P2 and may not be placed in the first region P1. A plurality of the first and second through vias 310 and 320 may be placed side by side and formed in the first direction X and the second direction Y in which the connecting structure 100 extends.

Specifically, the plurality of through vias 300 may include two second through vias 320 that are closest to each other among the plurality of second through vias 320 arranged to form a part of the first row, and two first through vias 310 that are closest to each other among the plurality of first through vias 310 arranged to form a part of the second row. A third through via may be placed between the two first through vias 310 and the two second through vias 320.

In these cases, the width of the third through via 330 may be smaller than the widths of the first and second through vias 310 and 320. For example, the diameters R1 and R2 of the upper surfaces of each of the first and second through vias 310 and 320 may be the same as each other, and the diameter R3 of the upper surface of the third through via 330 may be smaller than the diameters R1 and R2 of the upper surfaces of each of the first and second through vias 310 and 320. The third through via 330 is placed between the first and second through vias 310 and 320.

The third through via 330 may be in direct contact with at least one of the two first through vias 310 and the two second through vias 320. For example, the first to third through vias 310, 320 and 330 may be placed to come into contact with each other in the first direction X and the second direction Y with the insulating layer 110 interposed therebetween. The side surfaces of each of the first to third through vias 310, 320, and 330 adjacent to each other may come into contact with each other in the first direction X and the second direction Y.

Centers C1, C2, and C3 of the upper surfaces of the first to third through vias 310, 320 and 330 adjacent to each other may form a triangular shape in which the sum of the respective radii is defined as sides. Referring to FIG. 20, the plurality of through vias 300 may form a triangular shape in which the sum of the radius of the first through via 310 and the radius of the second through via 320 is defined as a first side a1, the sum of the radius of the first through via 310 and the radius of the third through via 330 is defined as a second side a2, and the sum of the radius of the second through via 320 and the radius of the third through via 330 is defined as a third side a3. In this case, since the second side a2 and the third side a3 are the same, the above-mentioned triangle may be an isosceles triangle.

Referring to FIGS. 19 and 21, among the first to third through vias 310, 320, and 330, the side surface of the second through via 320 placed on the outermost part of the connecting structure 100 may be spaced apart from the outer peripheral surface of the connecting structure 100 in the first direction X and the second direction Y.

Referring to FIG. 21, the first and second through vias 310 and 320 may be placed with the third through via 330 interposed therebetween. Each of the side surfaces of each of the first and second through vias 310 and 320 adjacent to each other may come into contact with the side surface of the third through via 330.

Hereinafter, a semiconductor package according to some embodiments of the present invention will be described referring to FIGS. 22 to 23. For convenience of explanation, differences from the semiconductor packages shown in FIGS. 1 to 8 will be mainly described.

Figure 22:
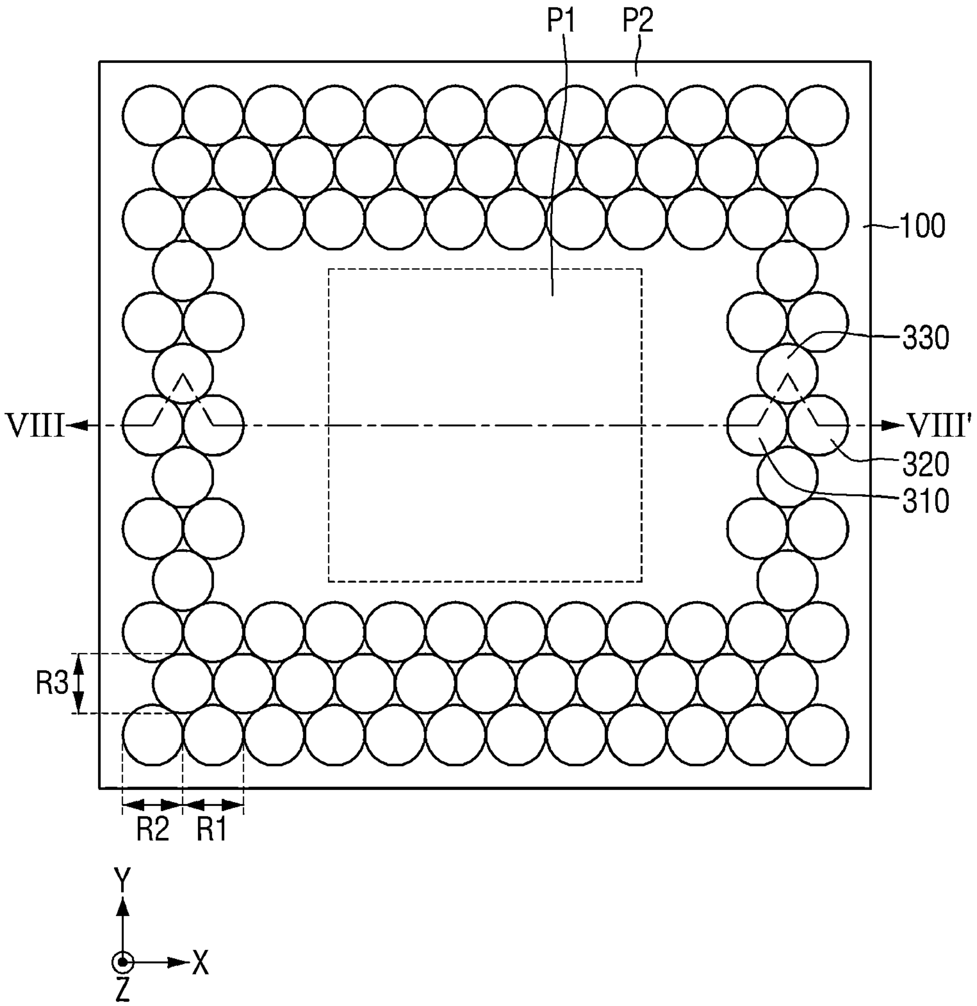
FIG. 22 is an example layout diagram of a semiconductor package according to some embodiments of FIG. 32.

FIG. 22 is an example layout diagram of a semiconductor package according to some embodiments of FIG. 32. FIG. 23 is a schematic cross-sectional view of a semiconductor package according to some embodiments taken along VIII-VIII' of FIG. 21.

Referring to FIG. 22, the plurality of through vias 300 may include two second through vias 320 that are closest to each other among the plurality of second through vias 320 arranged to form the first row, and two first through vias 310 that are closest to each other among the plurality of first through vias 310 arranged to form the second row. The third through via 330 may be in direct contact with at least one of the two first through vias 310 and the two second through vias 320.

In this case, the width of the third through via 330 may be the same as the width of the first and second through vias 310 and 320. For example, the diameters R1, R2, and R3 of the upper surfaces of each of the first and second through vias 310, 320 and 330 may the same as each other. The third through via 330 is placed between the first and second through vias 310 and 320.

The centers of the upper surfaces of the first to third through vias 310, 320 and 330 adjacent to each other may form a triangular shape in which the sum of the respective radii is defined as the sides of the triangle. In these cases, since the diameters of the upper surfaces of the first to third through vias 310, 320, and 330 are the same as each other, the above-mentioned triangle may be an equilateral triangle.

Figure 23:
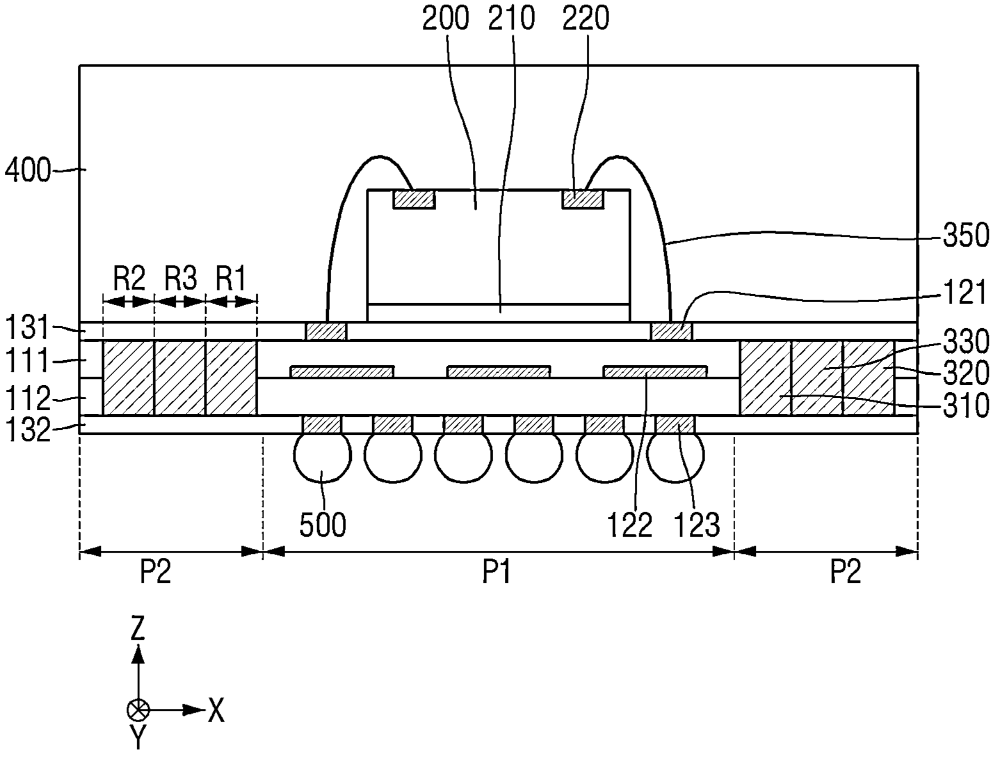
FIG. 23 is a schematic cross-sectional view of a semiconductor package according to some embodiments taken along VIII-VIII' of FIG. 21.

Referring to FIGS. 22 and 23, among the first to third through vias 310, 320 and 330, the side surface of the second through via 320 placed on the outermost part of the connecting structure 100 may be spaced apart from the outer peripheral surface of the connecting structure 100 in the first direction X and the second direction Y.

The first and second through vias 310 and 320 may be placed with the third through via 330 interposed therebetween. Each of the side surfaces of the first and second through vias 310 and 320 adjacent to each other may be come into contact with the side surface of the third through via 330.

Hereinafter, a semiconductor package according to some embodiments of the present invention will be described referring to FIGS. 24 to 25. For convenience of explanation, differences from the semiconductor packages shown in FIGS. 1 to 8 will be mainly described.

Figure 24:
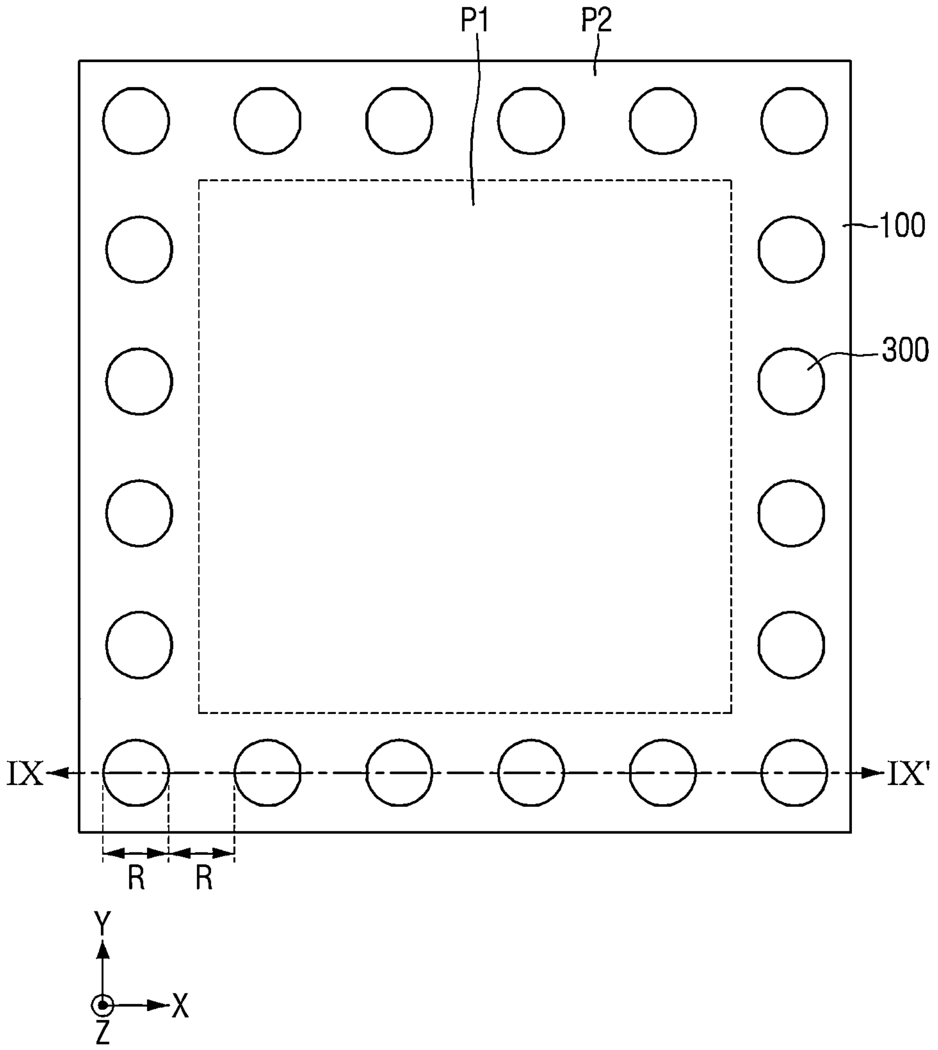
FIG. 24 is an example layout diagram of a semiconductor package according to some embodiments of FIG. 3.

FIG. 24 is an example layout diagram of a semiconductor package according to some embodiments of FIG. 3. FIG. 25 is a schematic cross-sectional view of a semiconductor package according to some embodiments taken along IX-IX' of FIG. 24.

Figure 25:
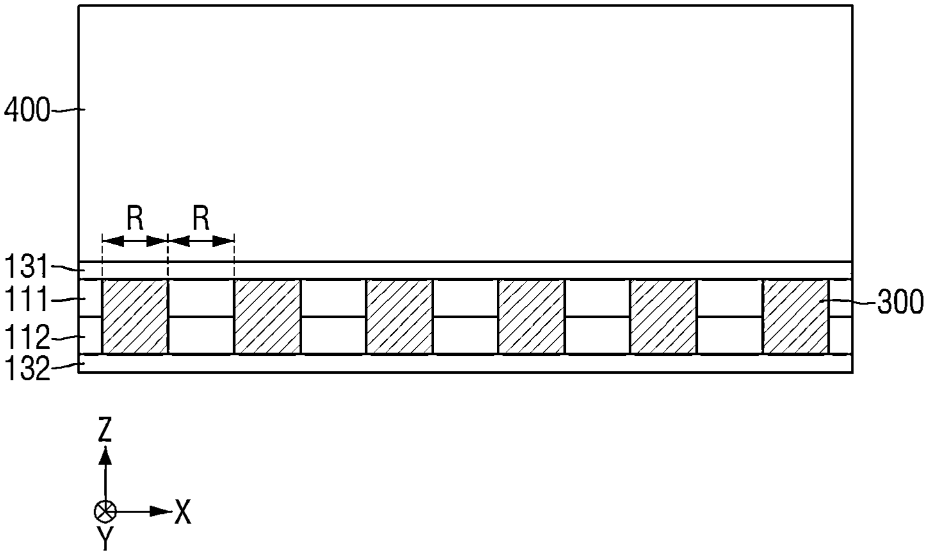
FIG. 25 is a schematic cross-sectional view of a semiconductor package according to some embodiments taken along IX-IX' of FIG. 24.

Referring to FIGS. 24 and 25, a plurality of through vias 300 may be placed side by side and formed in the first direction X and the second direction Y in which the connecting structure 100 extends. The plurality of through vias 300 may form a row along the outside of the connecting structure 100 and may be continuously placed. The widths of the plurality of through vias 300 may the same as each other.

The plurality of through vias 300 may be spaced apart from each other in the first direction X and the second direction Y by a distance corresponding to the diameter R of the upper surface of the through via 300 with the insulating layer 110 interposed therebetween.

Hereinafter, a semiconductor package according to some embodiments of the present invention will be described referring to FIGS. 26 and 27. For convenience of explanation, differences from the semiconductor packages shown in FIGS. 1 to 8 will be mainly described.

Figure 26:
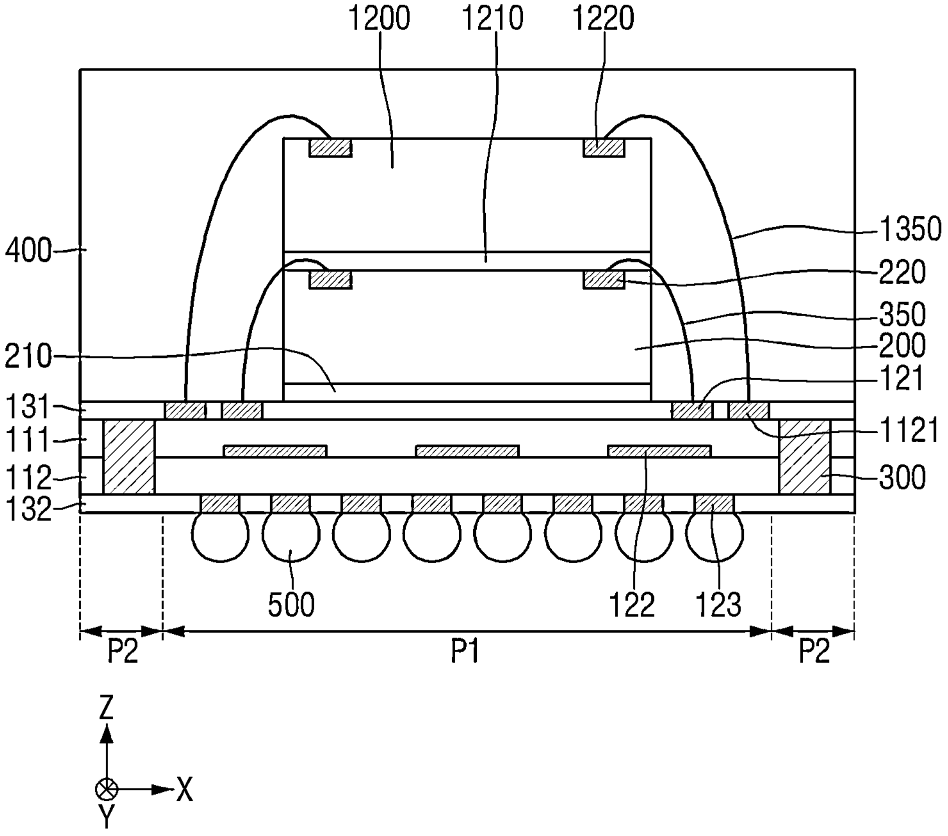
FIG. 26 is a schematic cross-sectional view of a semiconductor package according to some embodiments taken along I-I' of FIG. 4.

FIG. 26 is a schematic cross-sectional view of a semiconductor package according to some embodiments taken along I-I' of FIG. 4.

Referring to FIG. 26, in the semiconductor package according to some embodiments, a plurality of semiconductor chips 200 and 1200 may be stacked. The semiconductor chip 200 placed at the lower part may be, for example, a processor chip, and the semiconductor chip 1200 placed at the upper part may be, for example, a memory chip. An adhesive layer 1210 is placed between the semiconductor chip 200 and the semiconductor chip 1200 so that the semiconductor chip 1200 may be fixed on the semiconductor chip 200. The connecting pad 220 of the semiconductor chip 200 may be connected to the substrate through a wire 350, and the connecting pad 1220 of the semiconductor chip 1200 may be connected to the substrate through a wire 1350.

Figure 27:
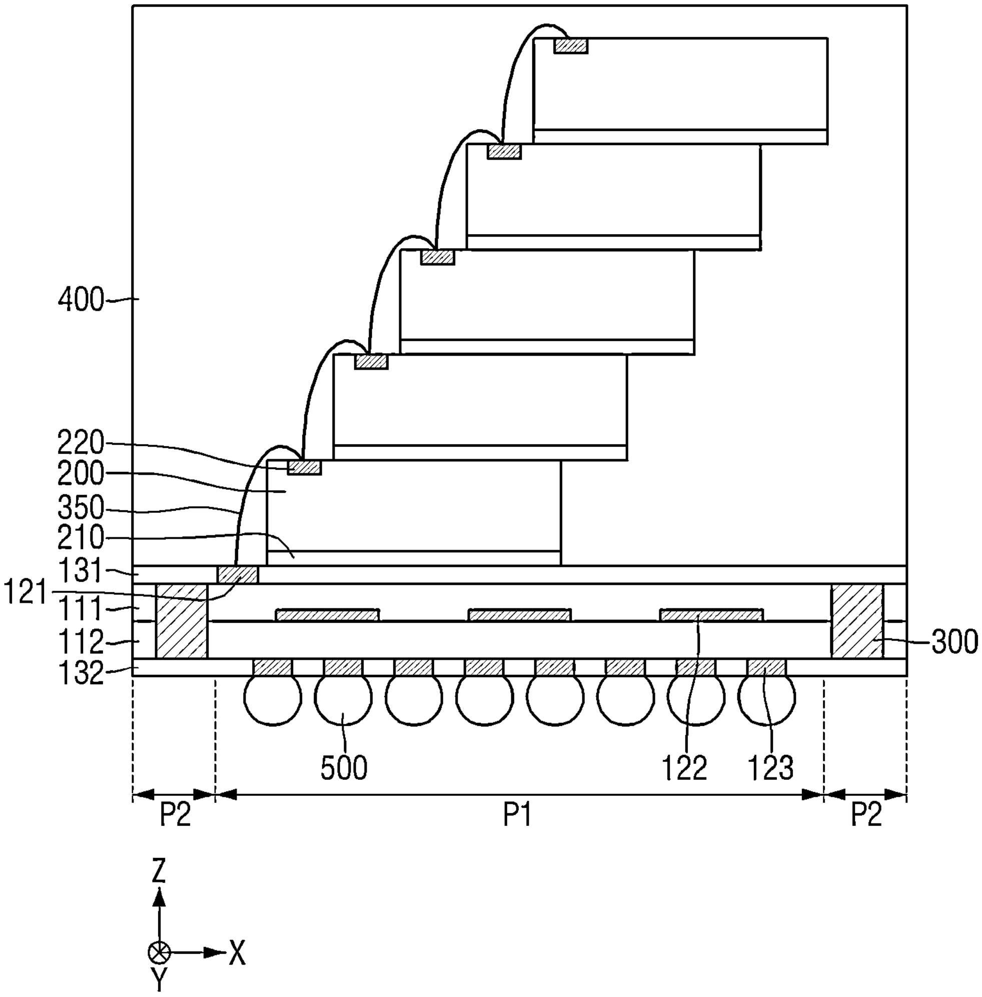
FIG. 27 is a schematic cross-sectional view of a semiconductor package according to some embodiments taken along I-I' of FIG. 4.

FIG. 27 is a schematic cross-sectional view of a semiconductor package according to some embodiments taken along I-I' of FIG. 4.

Referring to FIG. 27, in the semiconductor package according to some embodiments, a plurality of semiconductor chips 200 may be stacked.

The plurality of semiconductor chips 200 may be stacked in the form of a stair that goes up and to the right (or in the form of a stair that goes down to the left). By stacking the semiconductor chips in the form of stair in this way, the pads 220 of each chip 200 may be exposed, and the plurality of exposed pads 220 may be electrically connected to the connecting structure 100 through the wire 350.

The stacked semiconductor chips 1200 and/or 200 of FIGS. 26 and 27 may also be applied to any one of the above example embodiments.

In concluding the detailed description, those skilled in the art will appreciate that variations and modifications may be made to the example embodiments without substantially departing from the principles of the present invention. Therefore, the disclosed example embodiments of the invention are used in a generic and descriptive sense only and not for purposes of limitation.

What is claimed is:

1. A semiconductor package comprising:
- a semiconductor chip; and
- a connecting structure under the semiconductor chip, the connecting structure including
  - a plurality of stacked wiring layers,
  - a plurality of insulating layers between the plurality of stacked wiring layers,
  - a first passivation layer covering at least a portion of an uppermost layer of the plurality of insulating layers, a second passivation layer covering at least a portion of a lowermost layer of the plurality of insulating layers, a connecting terminal on a lower part of the connecting structure, and at least one through via penetrating the plurality of insulating layers such that the at least one through via contacts a lower surface of the first passivation layer and an upper surface of the second passivation layer, wherein the at least one through via is not electrically connected to at least one of the connecting terminal or the semiconductor chip.

2. The semiconductor package of claim 1, wherein the at least one through via is a plurality of through vias, and the plurality of through vias continuously extend along an edge of the connecting structure.

3. The semiconductor package of claim 1, wherein the at least one through via is a plurality of through vias, the connecting structure includes a first region in which the connecting terminal is placed, and a second region outside the first region, and the plurality of through vias are in the second region and are not in the first region of the connecting structure.

4. The semiconductor package of claim 3, wherein the plurality of through vias include:

a first row including a plurality of first through vias extending along an edge of the connecting structure, and a second row including a plurality of second through vias between the first row and the first region, wherein an extension direction of the first row and an extension direction of the second row are aligned with each other.

5. The semiconductor package of claim 4, wherein the plurality of through vias include two first through vias which are closest to each other among the plurality of first through vias, two second through vias which are closest to each other among the plurality of second through vias, and a third through via inside a virtual square formed by the two first through vias and the two second through vias.

6. The semiconductor package of claim 5, wherein the third through via is in direct contact with at least one of the two first through vias and the two second through vias.

7. The semiconductor package of claim 1, wherein the at least one through via is not electrically connected to the connecting terminal and the at least one through via is not electrically connected to the semiconductor chip.

8. The semiconductor package of claim 1, further comprising:

a mold layer covering the semiconductor chip, wherein the at least one through via does not contact the mold layer.

9. The semiconductor package of claim 1, wherein a width of the at least one through via decreases toward one side of the connecting structure.

10. A semiconductor package comprising:

a connecting structure including at least one wiring layer, at least one first insulating layer, second insulating layers above and below the at least one first insulating layer, and a through via penetrating the at least one first insulating layer;

a connecting terminal below the connecting structure;

a semiconductor chip above the connecting structure; and a mold layer covering the semiconductor chip, wherein the through via does not contact the mold layer, and wherein the through via is not electrically connected to at least one of the connecting terminal or the semiconductor chip.

11. The semiconductor package of claim 10, wherein an upper surface of the through via contacts an upper surface of the at least one first insulating layer, and a lower surface of the through via contacts a lower surface of the at least one first insulating layer.

12. The semiconductor package of claim 10, wherein the connecting structure includes a first region and a second region outside the first region, the connecting terminal is in the first region, and the through via is in the second region and extends along an edge of the connecting structure.

13. The semiconductor package of claim 10, wherein the through via is not electrically connected to the connecting terminal and the through via is not electrically connected to the semiconductor chip.

14. The semiconductor package of claim 10, wherein a width of the through via decreases toward a lower part of the connecting structure.

15. The semiconductor package of claim 10, wherein the at least one first insulating layer is a plurality of first insulating layers comprising a lower insulating layer and an upper insulating layer on the lower insulating layer, the through via includes a lower through via penetrating the lower insulating layer, and an upper through via on the lower through via and penetrating the upper insulating layer, and a width of an upper surface of the lower through via is greater than a width of a lower surface of the upper through via.

16. A substrate comprising:

at least one wiring layer, at least one insulating layer, and at least one passivation layer on the at least one insulating layer, each extending in a first direction and a second direction different from the first direction;

a connecting terminal under a first region of the substrate; and a plurality of through vias in a second region of the substrate, the plurality of through vias extending along the first direction and the second direction and penetrating a part of the substrate, wherein the plurality of through vias are not electrically connected to the connecting terminal, and the plurality of through vias do not contact an uppermost surface and side surfaces of the substrate.

17. The substrate of claim 16, wherein upper surfaces of the plurality of through vias contact an upper surface of the at least one insulating layer.

18. The substrate of claim 16, wherein the plurality of through vias include at least one first through via closest to the first region in the second region, and at least one second through via closest to an outside edge of the second region.

19. The substrate of claim 18, wherein the at least one first through via and the at least one second through via are side by side in the first direction and the second direction.

20. The substrate of claim 18, wherein the plurality of through vias further include a third through via, a width of the third through via is smaller than a width of the at least one first through via and a width of the at least one second through via, and the third through via is between the at least one first through via and the at least one second through via.

* * * * *